United States Patent
Yeo et al.

(10) Patent No.: US 6,946,342 B2
(45) Date of Patent: Sep. 20, 2005

(54) SEMICONDUCTOR DEVICE AND METHOD FOR MANUFACTURING THE SAME

(75) Inventors: Jae-Hyun Yeo, Seoul (KR); Sung-Tae Kim, Seoul (KR); Young-Sun Kim, Suwon (KR); In-Sung Park, Seoul (KR); Seok-Jun Won, Seoul (KR); Yun-Jung Lee, Seoul (KR); Ki-Vin Im, Suwon (KR); Ki-Yeon Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/452,979

(22) Filed: Jun. 2, 2003

(65) Prior Publication Data

US 2004/0033661 A1 Feb. 19, 2004

(30) Foreign Application Priority Data

Aug. 16, 2002 (KR) ................ 10-2002-0048404

(51) Int. Cl.$^7$ ........................................ H01L 21/8242
(52) U.S. Cl. ...................... 438/240; 438/239; 438/381
(58) Field of Search ................. 438/240, 239, 438/381, 647, 648, 650, 656, 657, 680, 681, 682, 683, 684, 685, 663, 686, 745

(56) References Cited

U.S. PATENT DOCUMENTS

| | | | | |
|---|---|---|---|---|
| 5,440,157 A | * | 8/1995 | Imai et al. .................. 257/310 |
| 5,641,702 A | * | 6/1997 | Imai et al. .................. 438/396 |
| 6,211,033 B1 | * | 4/2001 | Sandhu et al. ............... 438/387 |
| 6,287,965 B1 | * | 9/2001 | Kang et al. .................. 438/648 |
| 6,399,491 B2 | * | 6/2002 | Jeon et al. ................... 438/680 |
| 6,423,629 B1 | * | 7/2002 | Ahn et al. ................... 438/622 |
| 6,596,583 B2 | * | 7/2003 | Agarwal et al. ............. 438/255 |
| 6,599,794 B2 | * | 7/2003 | Kiyotoshi et al. .......... 438/240 |
| 6,635,561 B2 | * | 10/2003 | Kawai et al. ................ 438/622 |
| 6,660,631 B1 | * | 12/2003 | Marsh ......................... 438/680 |
| 6,660,660 B2 | * | 12/2003 | Haukka et al. .............. 438/778 |
| 6,828,190 B2 | * | 12/2004 | Lee et al. .................... 438/240 |
| 2001/0024387 A1 | | 9/2001 | Raaijmakers et al. | |
| 2002/0115252 A1 | | 8/2002 | Haukka et al. | |

FOREIGN PATENT DOCUMENTS

| | | |
|---|---|---|
| KR | P2001-0082118 | 8/2001 |
| KR | P2002-0002596 | 1/2002 |
| KR | P2002-0034520 | 5/2002 |

OTHER PUBLICATIONS

English Language Abstract of Korean Publication No: P2002-0002596.
English Language Abstract of Korean Publication No: P2002-0034520.
English Language Abstract of Korean Publication No: P2001-0082118.

* cited by examiner

*Primary Examiner*—David Nhu
(74) *Attorney, Agent, or Firm*—Marger Johnson & McCollom, P.C.

(57) ABSTRACT

A semiconductor device and a method for forming the same. A dielectric layer is formed on a semiconductor substrate or on a lower electrode of a capacitor. Vacuum annealing is performed on the dielectric layer. Thus, impurities remaining in the dielectric layer can be effectively removed, and the dielectric layer can be densified. As a result, the electrical characteristics of the semiconductor device are improved. For example, the leakage current characteristics of the dielectric layer are improved and capacitance is increased.

41 Claims, 26 Drawing Sheets

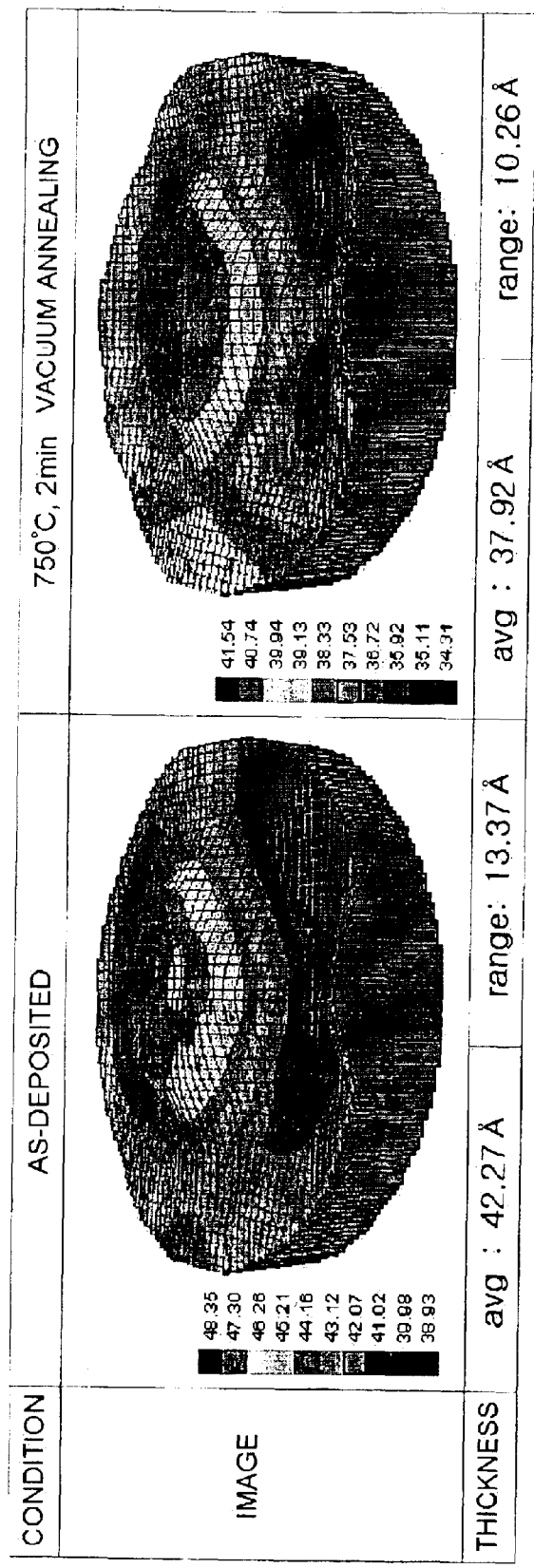

FIG. 5B

| CONDITION | AFTER-DEPOSITION THICKNESS | AFTER-VACUUM ANNEALING THICKNESS | AFTER-ETCHING THICKNESS (HF, 10sec) | ETCHING RATE |
|---|---|---|---|---|
| VACUUM ANNEALING | 37.2Å | 33.5Å | 32.2Å | 1.8Å/min |
| AS-DEPOSITED STATE | 38.1Å | — | 2.9Å | 211.2Å/min | ic
SEMICONDUCTOR DEVICE AND METHOD FOR MANUFACTURING THE SAME

BACKGROUND OF THE INVENTION

1. Field of the Invention

The present invention relates to semiconductor devices and, more particularly, to a semiconductor device, such as a capacitor, having enhanced electrical characteristics. The invention also relates to a method for manufacturing the same.

2. Description of the Related Art

To increase the integration density of semiconductor devices, various methods have been employed. These methods include reducing the thickness of a gate or capacitor dielectric layer, or forming a high-k dielectric layer, for example, to increase capacitance. Unfortunately, although reducing the dielectric layer thickness increases the capacitance, it also significantly increases leakage current. In addition, forming a high-k dielectric layer often requires the use of a metal electrode, because a conventional polysilicon electrode causes problems such as tunneling and increases leakage current. In the case of such a metal-insulator-metal (MIM) capacitor with a high-k dielectric layer, due to a high-speed dielectric growth process typically required for mass production, the high-k dielectric layer suffers from a substantial amount of oxygen non-stoichiometry. Thus, a thermal process in an oxygen ambient is needed to stabilize the stochiometry in the lack of oxygen to cure defects occurring in the dielectric layer during the deposition or to remove impurities present in the dielectric layer. When such a thermal process is performed, however, oxygen atoms react with an electrode, thereby growing an unnecessary oxide layer that reduces capacitance.

To avoid the oxidation, the thermal process may be performed in a low-concentration oxygen ambient, or in an inert gas (e.g., $N_2$ or Ar) ambient. This process is, however, ineffective to remove impurities, such as carbon, present in the dielectric layer. Furthermore, thermo-mechanical stresses generated between the electrode and the dielectric layer during the high-temperature thermal process increase leakage current and further increase contact resistance.

Accordingly, there is an immediate need for novel thermal processing techniques to deal with problems such as described above.

SUMMARY OF THE INVENTION

A semiconductor device and a method for forming the same are provided. According to one embodiment, a dielectric layer is formed on a semiconductor substrate or on a lower electrode of a capacitor. Vacuum annealing is performed on the dielectric layer. Thus, impurities remaining in the dielectric layer can be removed, and the dielectric layer can be effectively densified. As a result, the electrical characteristics of the semiconductor device are improved. For example, the leakage current characteristics of the dielectric layer are improved and capacitance is increased.

BRIEF DESCRIPTION OF THE DRAWINGS

The above objects and advantages of the present invention will become more readily apparent through the following detailed description of preferred embodiments thereof, made with reference to the attached drawings, in which:

FIG. 5A provides a contour mapping of a capacitor region of a semiconductor memory device illustrating a reduction in the thickness of the $HfO_2$ dielectric layer after vacuum annealing.

FIG. 5B is a table comparing the results of HF wet etching to illustrate the stability of the $HfO_2$ dielectric layer densified through vacuum annealing;

DETAILED DESCRIPTION OF PREFERRED EMBODIMENTS

Figure 1A:
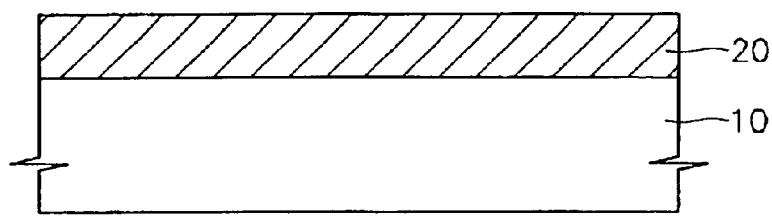
FIGS. 1A through 1D are partial cross-sectional views of a semiconductor memory device illustrating a method for manufacturing a capacitor of the semiconductor memory device according to a first embodiment of the present invention.

It should be understood that the exemplary embodiments of the present invention described below may be modified in many different ways without departing from the inventive principles disclosed herein. The scope of the present invention is therefore not limited to these particular embodiments. Rather, these embodiments are provided by way of example and not of limitation.

In the drawings, the thicknesses of layers and regions are exaggerated for clarity. It will also be understood that when a layer is referred to as being "on" another layer or substrate, it can be directly on the other layer or substrate, or intervening layers may be present.

FIGS. 1A through 1D illustrate a method of manufacturing a capacitor of a semiconductor memory device according to a first embodiment of the present invention. Referring to FIG. 1A, a lower electrode 20 is formed on a semiconductor substrate 10 to a thickness of approximately tens to hundreds of angstroms (Å). The lower electrode 20 can be formed, for example, of polysilicon, a metal nitride, or a noble metal. For instance, the lower electrode 20 may be formed of a single layer of doped polysilicon, TiN, TaN, WN, Ru, Ir, or Pt, or a composite layer of TiN, TaN, WN, Ru, Ir, or Pt. When the lower electrode 20 is formed of doped polysilicon, the surface of the lower electrode 20 is subjected to rapid thermal nitridation (RTN) to form a silicon nitride layer (not shown) on the lower electrode 20. This prevents the lower electrode 20 from being oxidized during subsequent thermal processes.

Figure 1B:
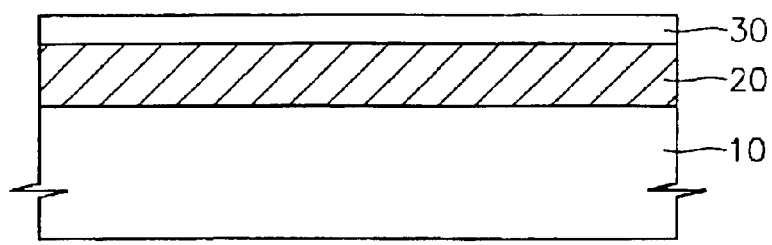

Referring to FIG. 1B, an HfO$_2$ dielectric layer 30 is formed on the lower electrode 20 to a thickness of about 20–200 Å. The HfO$_2$ dielectric layer 30 can be formed by conventional techniques such as chemical vapor deposition (CVD) or atomic layer deposition (ALD). When the HfO$_2$ dielectric layer 30 is formed using CVD, an Hf source material, for example, HfCl$_4$, Hf(OtBu)$_4$, Hf(NEtMe)$_4$, Hf(MMP)$_4$, Hf(NEt$_2$)$_4$, or Hf(NMe$_2$)$_4$, and an oxygen gas are used at a temperature of about 400–500° C. and a pressure of about 1–5 torr. When the HfO$_2$ dielectric layer 30 is formed using ALD, HfCl$_4$ or a metal organic precursor (e.g., Hf(OtBu)$_4$, Hf(NEtMe)$_4$, Hf(MMP)$_4$, Hf(NEt$_2$)$_4$, or Hf(NMe$_2$)$_4$) as an HF source material, and alcohols containing H$_2$O, H$_2$O$_2$, or —OH radical, or O$_2$ or O$_3$ plasma as an oxygen source are used at a temperature of about 150–500° C. and a pressure of about 0.1–5 torr. The deposition and removing (purging or pumping) processes are repeated, as in the conventional ALD techniques, until the HfO$_2$ dielectric layer 30 reaches a desired thickness.

Figure 1C:
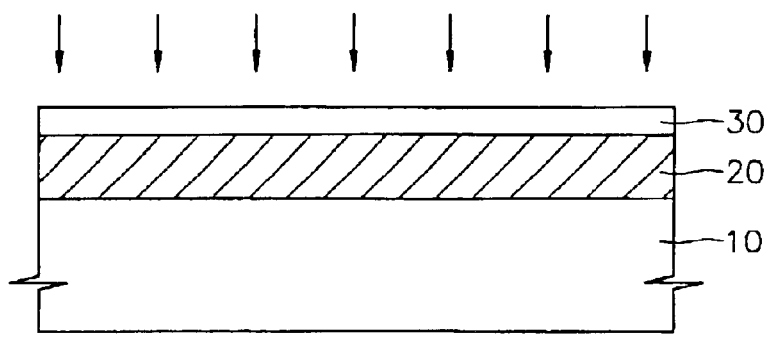

Referring to FIG. 1C, the HfO$_2$ dielectric layer 30 is thermally treated by vacuum annealing. The vacuum annealing is performed without supplying an inert gas or a reactant gas onto the HfO$_2$ dielectric layer 30. While evacuating the reaction chamber to a high vacuum level of about $1 \times 10^{-8}$–1 torr, vacuum annealing is performed on the HfO$_2$ dielectric layer 30 at a temperature of about 200–850° C., (most preferably, about 700–800° C. when the lower electrode is formed of polysilicon or about 400–600° C. when the lower electrode is formed of a metal nitride or a noble metal). Through the vacuum annealing, impurities, such as carbon, which remain on the HfO$_2$ dielectric layer 30, can be effectively removed without degrading the electrical characteristics of the capacitor. The HfO$_2$ dielectric layer 30 can therefore become effectively densified.

Figure 1D:
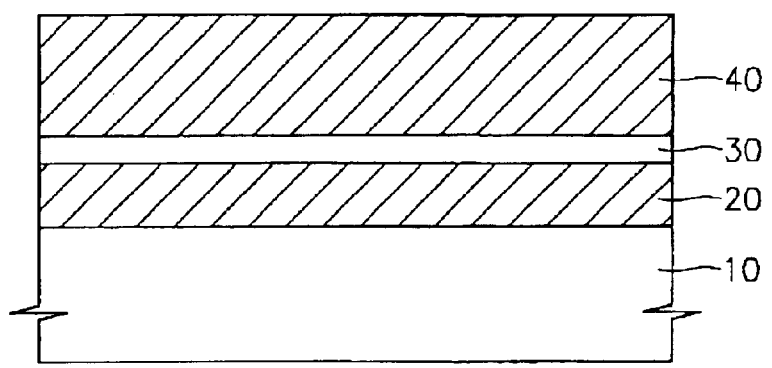

Referring to FIG. 1D, an upper electrode 40 is formed on the HfO$_2$ dielectric layer 30 to a thickness of about 50–2000 Å. The upper electrode 40 can, for instance, be formed of a single layer of polysilicon, a metal nitride, a noble metal, or a composite layer of these materials. For example, the upper layer 40 may be formed of a single layer of polysilicon, TiN, TaN, WN, Ru, Ir, or Pt, or a composite layer of these materials. Suitable composite layers for the upper electrode 40 include, for example, TiN/polysilicon, TaN/polysilicon, Ru/TiN. The upper electrode 40 may be formed by ALD, CVD, or metal-organic chemical vapor deposition (MOCVD), with the MOCVD technique being more preferred. When the upper electrode 40 is formed by MOCVD, a metal organic material is used as a source metal material. Because a Cl-containing material is not used as the source material, the leakage current characteristic of the capacitor including the HfO$_2$ dielectric layer 30 is not degraded.

Figure 2:
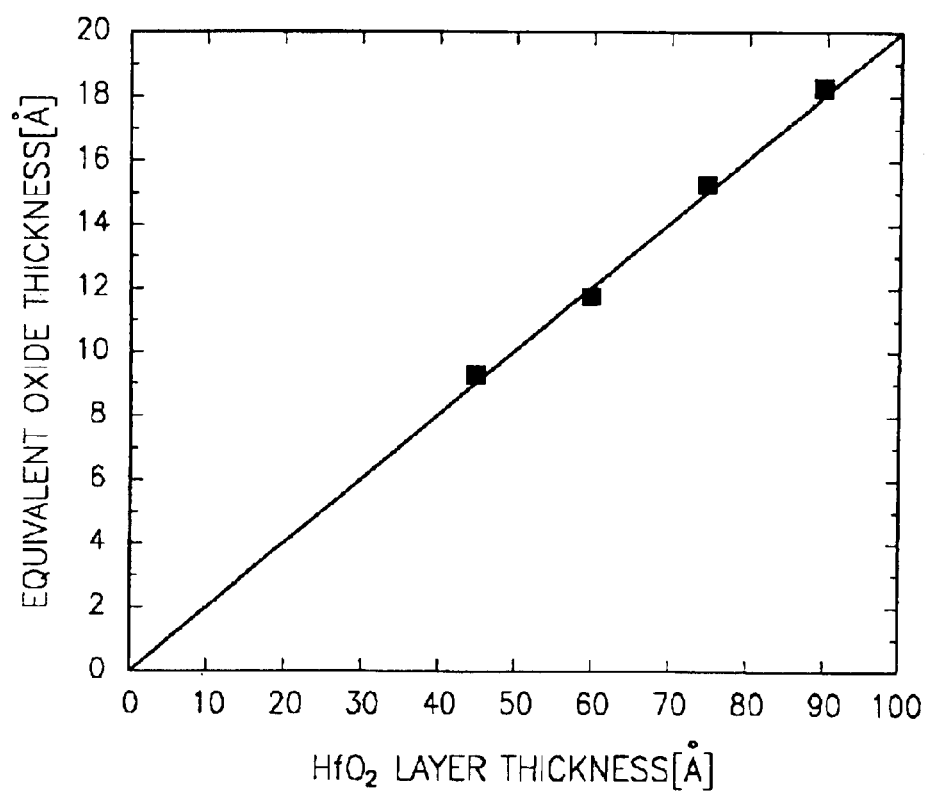
FIG. 2 is a graph representing the relationship between an $HfO_2$ dielectric layer thickness and an equivalent oxide thickness (EOT) in a capacitor manufactured using the method of FIGS. 1A through 1D.

FIG. 2 is a graph illustrating the relationship between the thickness of the HfO$_2$ dielectric layer and an equivalent oxide thickness (EOT) when the HfO$_2$ dielectric layer is formed having a variety of thicknesses on the lower electrode of TiN using the method of FIGS. 1A to 1D, followed by vacuum annealing at 450° C. As is apparent from FIG. 2, the HfO$_2$ dielectric layer thickness and the EOT have a linear relationship. The HfO$_2$ dielectric layer formed on the lower TiN electrode has a dielectric constant of 20.

Figure 3:
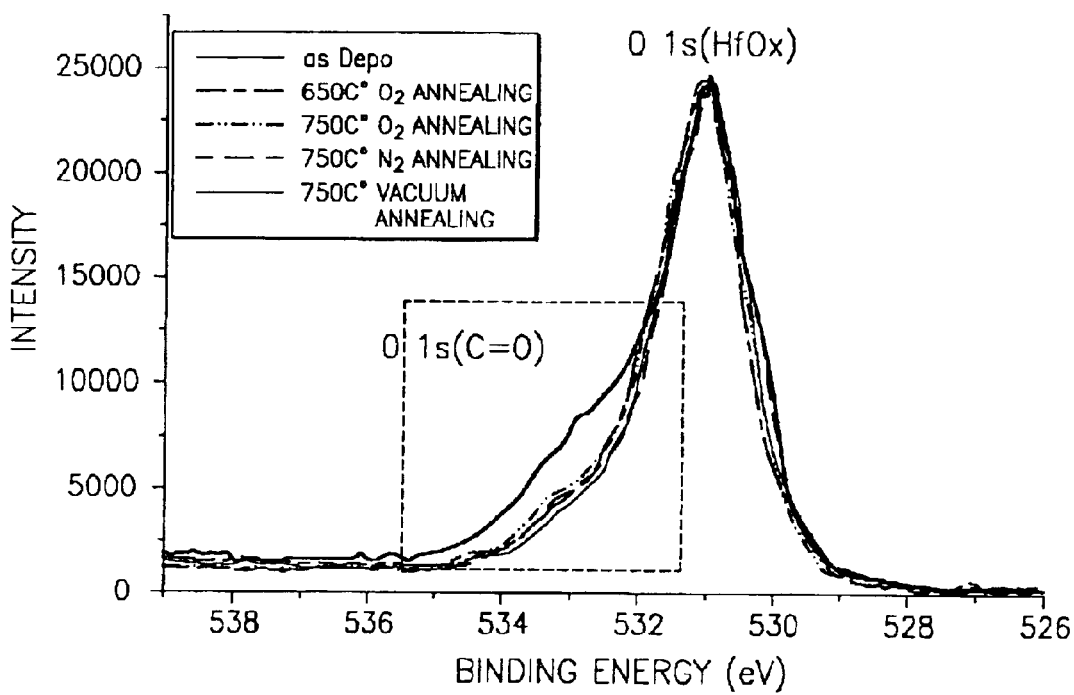
FIG. 3 is a graph illustrating changes in the binding state of $HfO_x$ when the $HfO_2$ dielectric layer is thermally treated using a variety of techniques.

FIG. 3 illustrates changes in the binding state of HfO$_x$ detected by X-ray photoelectron spectroscopy (XPS) after the HfO$_2$ dielectric layer deposited on a silicon substrate is thermally treated by a variety of techniques. Referring to FIG. 3, immediately after the deposition of the HfO$_2$ dielectric layer (as-deposited), a CO bond appears near 533 eV. However, as the thermal treatment is performed, the CO bond disappears and a stable HfO$_x$ bond is formed.

Figure 4:
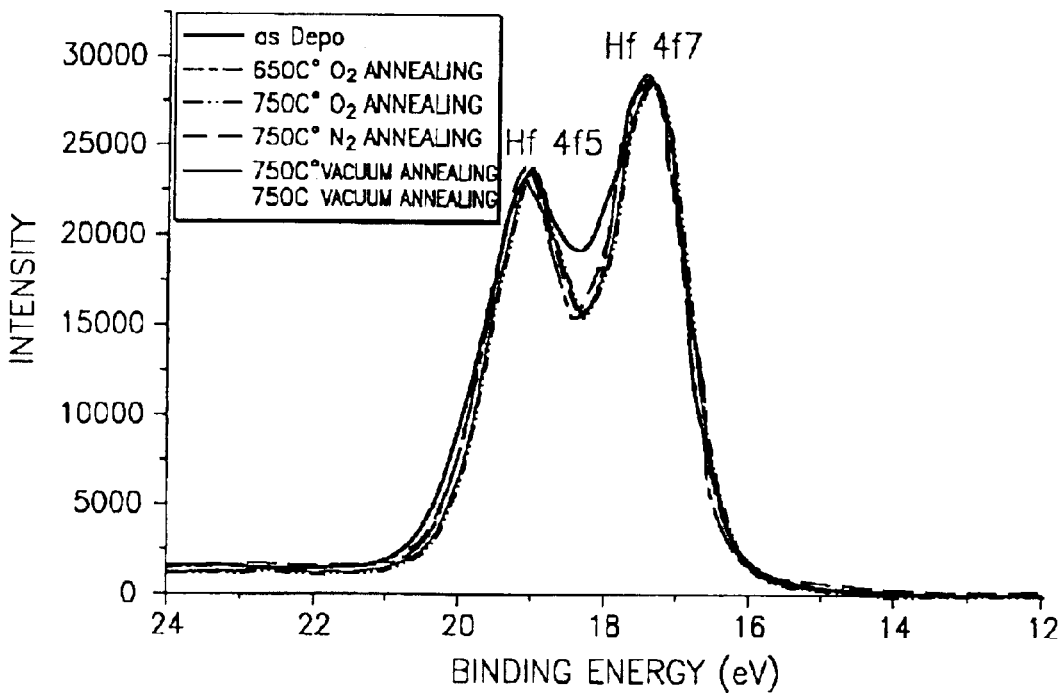
FIG. 4 is a graph illustrating Hf binding states when the $HfO_2$ dielectric layer is thermally treated under different conditions.

FIG. 4 is a graph showing the Hf binding state when the HfO$_2$ dielectric layer is thermally treated in different conditions. When vacuum annealing is performed after the deposition of the HfO$_2$ dielectric layer, the full width full maximum of Hf 4f7 and Hf 4f5 in the as-deposited state is reduced to result in a deep valley between the two peaks. It is believed that due to an increased number of stable HfO$_2$ bonds, more stable HfO$_2$ bonding is formed.

FIG. 5A shows a reduction in the thickness of the HfO$_2$ dielectric layer after vacuum annealing. Referring to FIG. 5A, through the vacuum annealing on the HfO$_2$ dielectric layer, the thickness of the HfO$_2$ dielectric layer is reduced by about 10%, compared to the as-deposited state. From this result, it is evident that the HfO$_2$ dielectric layer becomes denser through the vacuum annealing.

FIG. 5B is a table illustrating the results of HF wet etching performed to evaluate stability of the HfO$_2$ dielectric layer after undergoing the vacuum annealing. To investigate whether the stable bond remains in the HfO$_2$ dielectric layer densified through vacuum annealing, wet etching is performed on the HfO$_2$ dielectric layer in a HF etchant, after the deposition of the HfO$_2$ dielectric layer, and after vacuum annealing on the HfO$_2$ dielectric layer at 750° C. for 2 minutes. The thickness of the HfO$_2$ dielectric layer was measured before and after the wet etching and is shown in the table together with the etching rate. Referring to FIG. 5B, when the wet etching is performed in the as-deposited state, most of the HfO$_2$ dielectric layer was etched. In contrast, when the wet etching is performed after vacuum annealing, the thickness of the Hfo$_2$ dielectric layer remains substantially unchanged. The results shown in FIGS. 3, 4, 5A and 5B, demonstrate that the HfO$_2$ dielectric layer is further stabilized through vacuum annealing.

Figure 6:
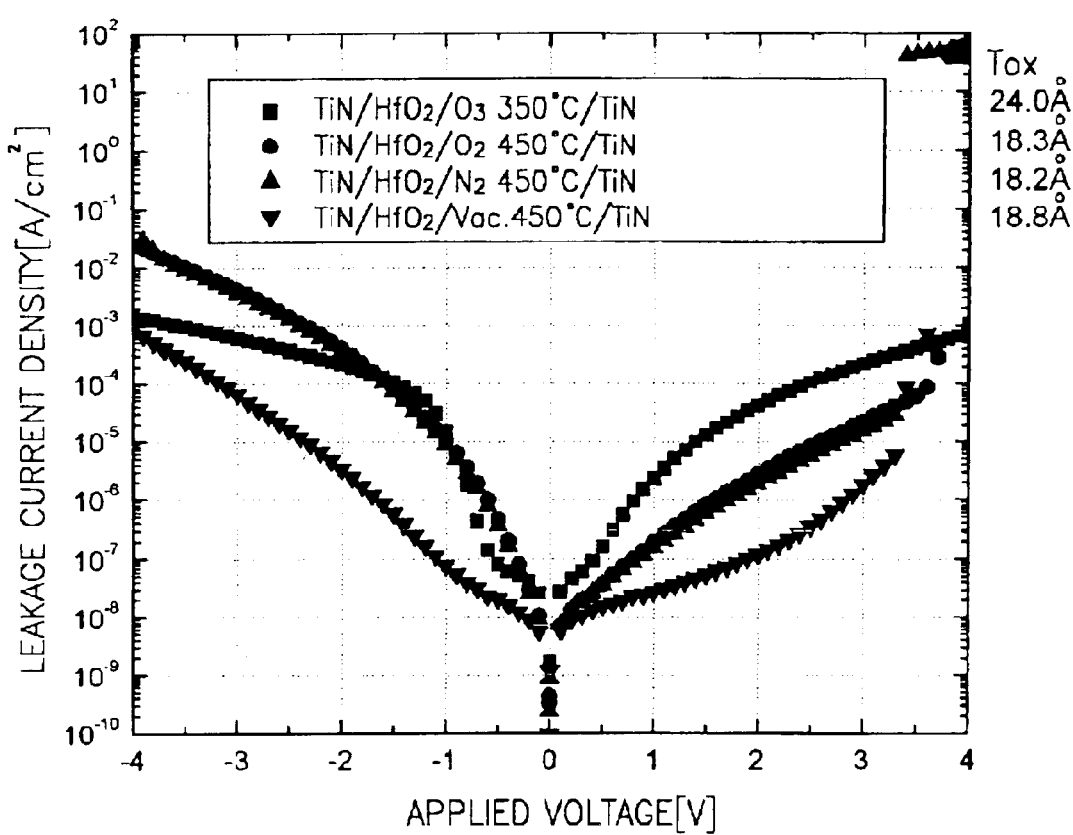
FIG. 6 is a graph comparatively showing the leakage current characteristics of the capacitor manufactured by the method of FIGS. 1A through 1D and those of capacitors manufactured by conventional methods.

FIG. 6 is a graph comparing leakage current characteristics of capacitors when the HfO$_2$ dielectric layer is thermally treated by vacuum annealing when the HfO$_2$ dielectric layer is thermally treated by other techniques. In FIG. 6, the EOT for each case is shown. To measure the leakage current characteristics, an HfO$_2$ dielectric layer is formed to a thickness of 90 Å on a lower electrode. The lower electrode is formed of a 200 Å thick TiN layer. The HfO$_2$ dielectric layer is then thermally treated by a variety of methods. An upper electrode is formed of an 800 Å thick TiN layer on the thermally treated HfO$_2$ dielectric layer. As shown, when the HfO$_2$ dielectric layer is thermally treated in an O$_3$ condition, the leakage current characteristic is significantly degraded, and the EOT is increased. When the HfO$_2$ dielectric layer is thermally treated in an O$_2$ condition and a N$_2$ condition, the EOT does not increase, but the leakage current characteristic degrades, compared with the case where the vacuum annealing is performed.

Figure 7:
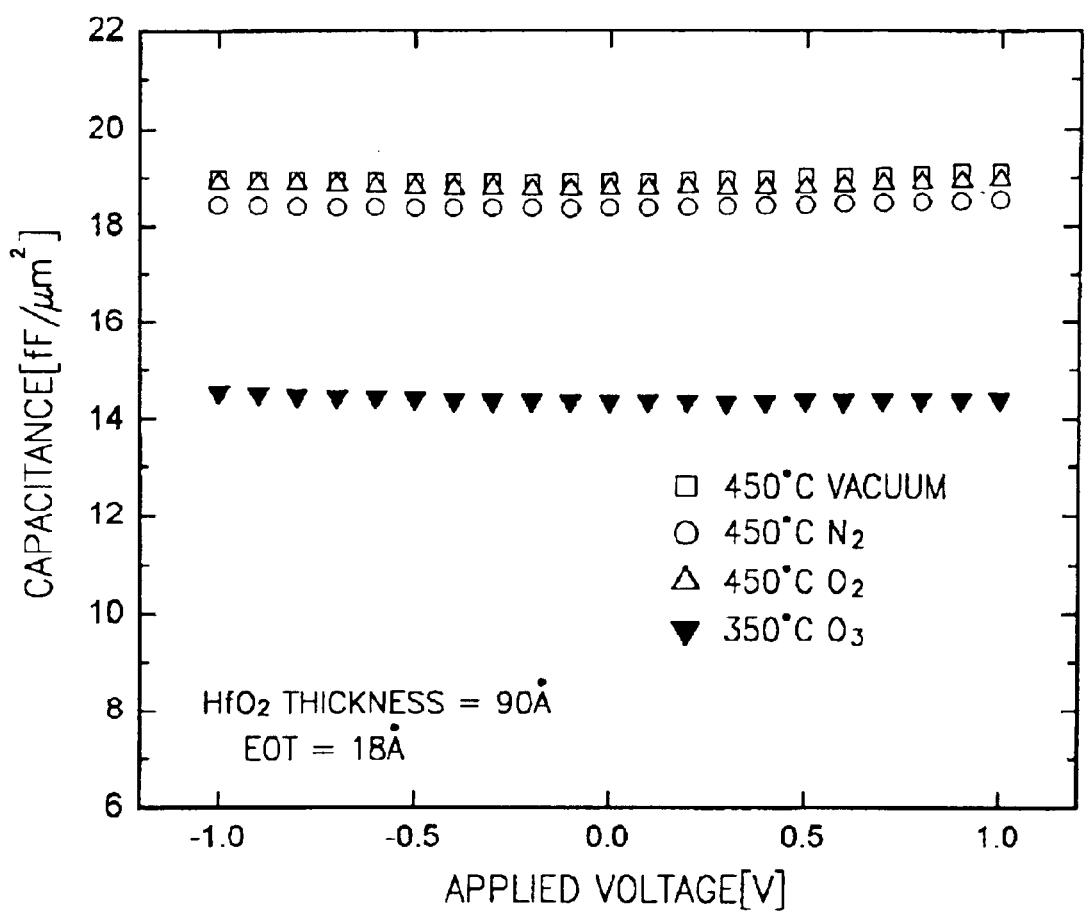
FIG. 7 is a graph representing capacitances of a capacitor of a semiconductor memory device when an $HfO_2$ dielectric layer formed on a TiN lower electrode of the capacitor by atomic layer deposition (ALD) is thermally treated using different methods.

FIG. 7 is a graph showing capacitance when the HfO$_2$ dielectric layer formed on the TiN lower electrode by ALD is thermally treated using different methods. When the HfO$_2$ dielectric layer is thermally treated in an O$_3$ condition, the oxygen atoms easily permeate the HfO$_2$ dielectric layer even at a low temperature to reach the interface between the HfO$_2$ dielectric layer and the TiN lower electrode. Thus, the TiN lower electrode can be easily oxidized. Accordingly, capacitance degradation, and micro lifting between the lower electrode and the HfO$_2$ dielectric layer occur. As a result, leakage current increases. In contrast, when the HfO$_2$ dielectric layer is thermally treated in a N$_2$ ambient or an O$_2$ ambient, capacitance is not degraded. Negative leakage current is greatly increased, however, as compared with vacuum annealing.

Figure 8A:
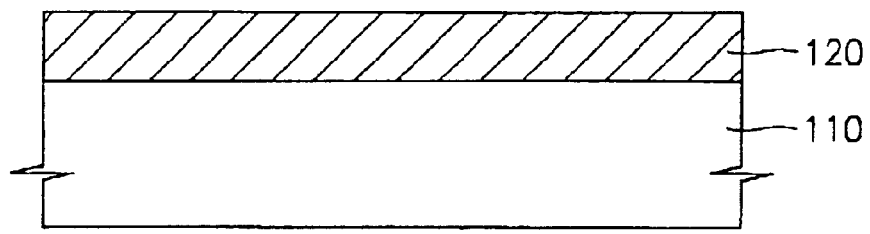
FIGS. 8A through 8F are partial cross-sectional views illustrating a method for manufacturing a capacitor of a semiconductor memory device according to a second embodiment of the present invention.

FIGS. 8A through 8F are partial cross-sectional views illustrating a method for manufacturing a capacitor of a semiconductor memory device according to a second embodiment of the present invention. Referring to FIG. 8A, a lower electrode 120 is formed on a semiconductor substrate 110 to an approximate thickness of tens to hundreds of angstroms (Å). The lower electrode 120 can be formed using the same or similar methods described above.

Figure 8B:
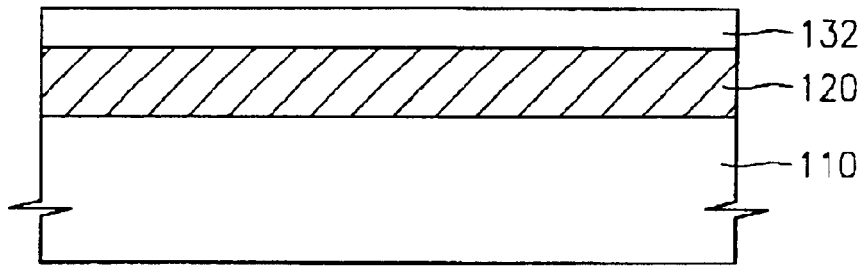

Referring to FIG. 8B, an Al$_2$O$_3$ dielectric layer 132 is formed on the lower electrode 120. Preferably, the Al$_2$O$_3$ dielectric layer is formed to a thickness of about 20–60 Å. It is preferable that the Al$_2$O$_3$ dielectric layer be thicker than an HfO$_2$ dielectric layer to be formed in a subsequent process. The reason for this will be described later.

The Al$_2$O$_3$ dielectric layer 132 may be formed by ALD. In this case, the Al$_2$O$_3$ dielectric layer 132 is deposited using trimethyl aluminum (TMA) as a first reactant and O$_3$ as a second reactant at a temperature of about 200–500° C. and a pressure of about 0.1–5 torr. The deposition and removing (purging or pumping) processes are repeated, as in the conventional ALD techniques, until the Al$_2$O$_3$ dielectric layer reaches a desired thickness. Suitable first reactants for the Al$_2$O$_3$ dielectric layer 132 include, for example, AlCl$_3$, AlH$_3$N(CH$_3$)$_3$, C$_6$H$_{15}$AlO, (C$_4$H$_9$)$_2$AlH, (CH$_3$)$_2$AlCl, (C$_2$H$_5$)$_3$Al, or (C$_4$H$_9$)$_3$Al, as well as TMA. H$_2$O, H$_2$O$_2$, or an activated oxidizing agent, such as plasma N$_2$O, plasma O$_2$, may be used as the second reactant. When the Al$_2$O$_3$ dielectric layer is formed using H$_2$O as the second reactant, the device reliability increases, although the dielectric constant and leakage current characteristic are similar to those when O$_3$ is used as the second reactant.

Figure 8C:
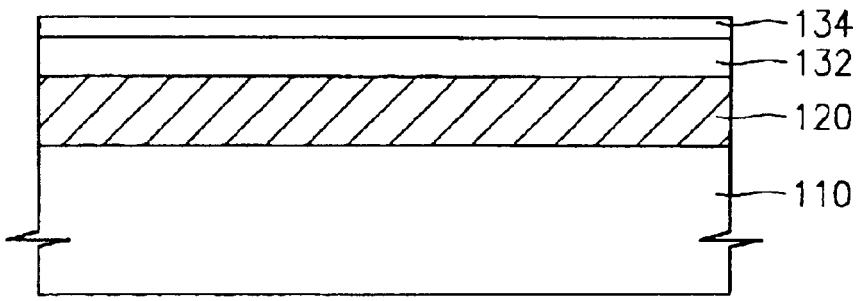

Referring to FIG. 8C, an HfO$_2$ dielectric layer 134 is formed on the Al$_2$O$_3$ dielectric layer 132 to form a composite dielectric layer of Al$_2$O$_3$/HfO$_2$. The composite dielectric layer of Al$_2$O$_3$/HfO$_2$ has a high dielectric constant and improved leakage current characteristics over the single Al$_2$O$_3$ dielectric layer, which has good leakage current characteristic but a low dielectric constant, and the single HfO$_2$ dielectric layer, which has a high dielectric constant but poor leakage current characteristics. In other words, the electrical characteristics of the capacitor can be improved by forming a composite Al$_2$O$_3$/HfO$_2$ dielectric layer. The HfO$_2$ dielectric layer 134 may be formed using the same or similar method described with reference to FIG. 1B. Preferably, the HfO$_2$ dielectric layer 134 is formed to a thickness of about 10–60 Å. As described above, it is preferable that the HfO$_2$ dielectric layer 134 be formed thinner than the Al$_2$O$_3$ dielectric layer 132.

Figure 8D:
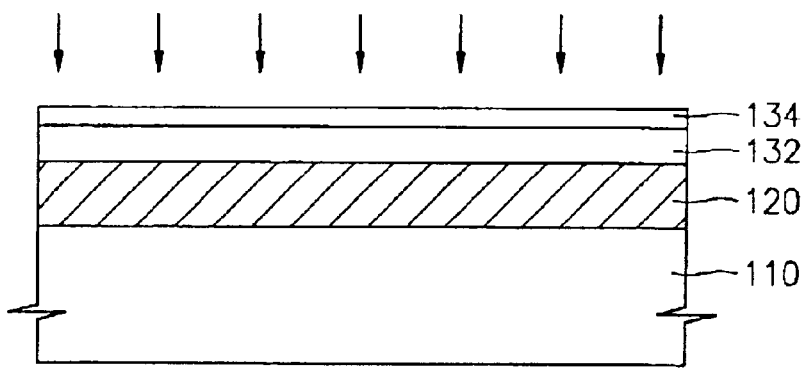

Referring to FIG. 8D, vacuum annealing is performed on the HfO$_2$ dielectric layer 134. The vacuum annealing of FIG. 8D is performed using the same or similar method described previously with reference to FIG. 1C. Through vacuum annealing, impurities, such as carbon, which remain on the HfO$_2$ dielectric layer 134, can be effectively removed, and the HfO$_2$ dielectric layer 134 can become effectively densified.

Figure 8E:
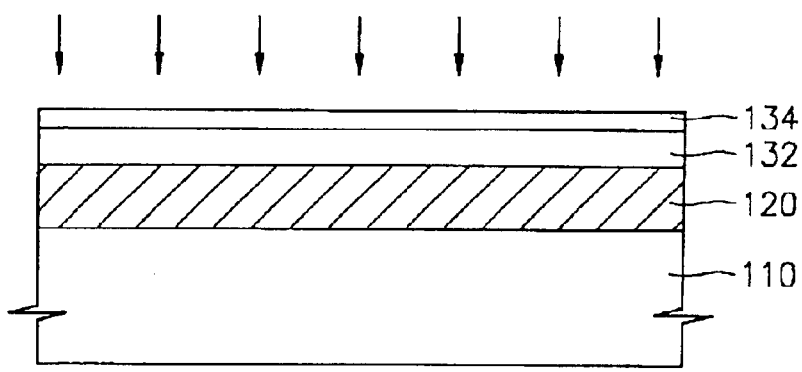

Referring to FIG. 8E, the vacuum-annealed HfO$_2$ dielectric layer 134 can optionally be thermally treated at a temperature of about 200–600° C., and preferably, about 300–400° C. (Alternatively, the thermal treatment in the oxygen condition is performed before the vacuum annealing described with reference to FIG. 8D.) The HfO$_2$ dielectric layer 134 is thermally treated at a pressure of about 5–50 torr in the O$_3$ plasma condition, or at a pressure of about 0.1–5 torr in the O$_2$ plasma condition. When the thermal treatment is performed in an oxygen condition, as described above with reference to FIG. 8E, the oxidation of the lower electrode 120 due to oxygen diffusion is a concern. However, the oxygen diffusion can be effectively blocked by the Al$_2$O$_3$ dielectric layer 132 and the densified HfO$_2$ dielectric layer 134. Thus, the lower electrode 120 is not oxidized. Specifically, when the lower electrode 120 is formed of metal, such as a metal nitride or a noble metal, the composite layered structure of the Al$_2$O$_3$ dielectric layer 132 and the HfO$_2$ dielectric layer 134 protects the lower electrode 120 from being oxidized.

Figure 8F:
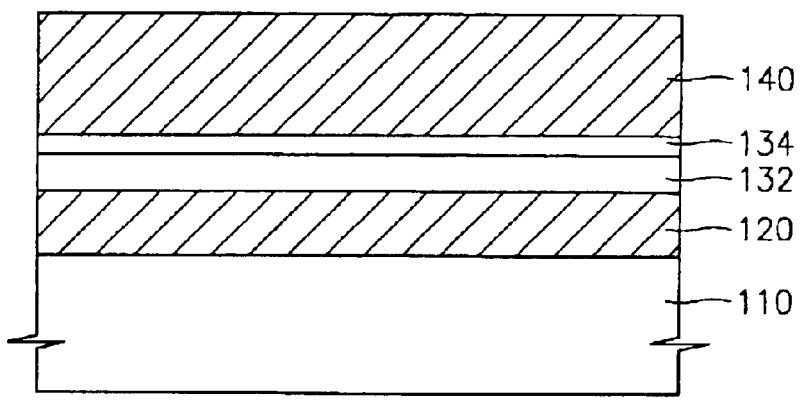

Referring to FIG. 8F, an upper electrode 140 is formed on the HfO$_2$ dielectric layer 134 thermally treated in a vacuum or oxygen condition, to a thickness of about 50–2000 Å. The upper electrode 140 may be formed using the same or similar methods described above. As stated above, when the upper electrode 140 is formed by MOCVD, a metal organic material is used as a source metal material. Because a Cl-containing material is not used as the source material, leakage current characteristic of the capacitor including the HfO$_2$ dielectric layer 134 is not degraded.

Figure 9:
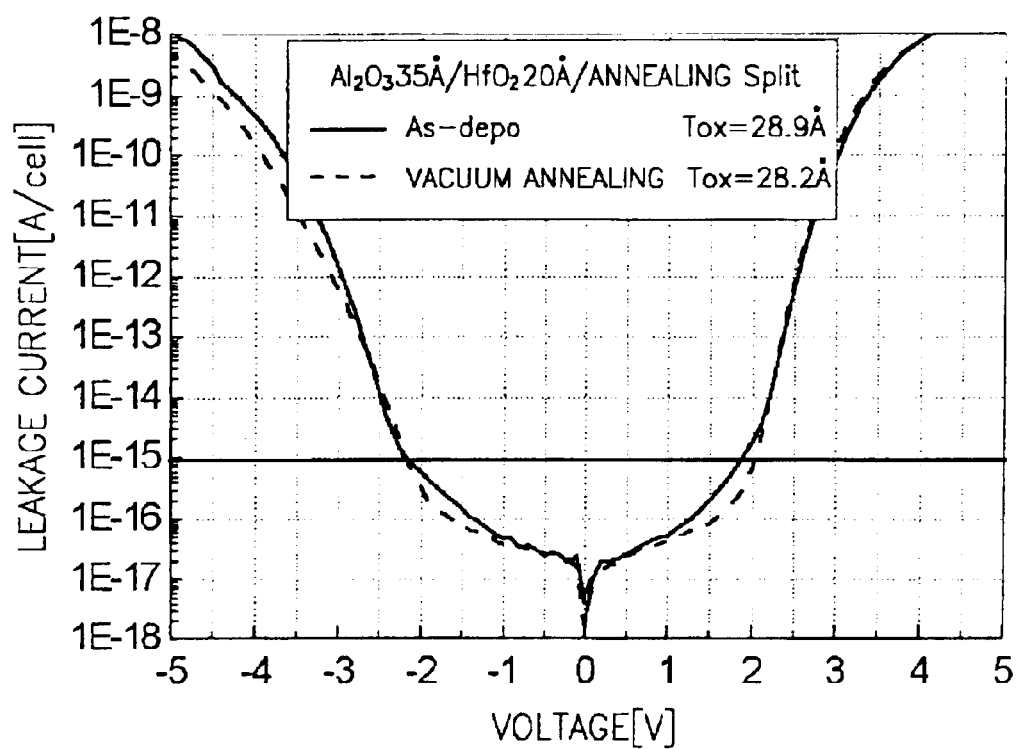
FIG. 9 is a graph representing electrical characteristics of capacitors formed having a composite $Al_2O_3/HfO_2$ dielectric layer structure using the method of FIGS. 8A through 8F.

FIG. 9 is a graph illustrating electrical characteristics of a capacitor having a composite Al$_2$O$_3$/HfO$_2$ dielectric layer. For the electrical characteristics measurement of FIG. 9, after a lower electrode was formed of a phosphorus-doped polysilicon layer, a silicon nitride layer was grown on the lower electrode by RTN. After Al$_2$O$_3$ and HfO$_2$ dielectric layers are sequentially formed, vacuum annealing is performed at 750° C. Next, an upper electrode is formed of a stacked TiN/polysilicon layer structure and annealed at 650° C. for activation. The resultant structure was subjected to photolithography and etching processes to complete a capacitor structure having an aspect ratio of about 10:1. The electrical characteristics thereof were then measured. As shown in FIG. 9, when the composite Al$_2$O$_3$/HfO$_2$ dielectric layer is thermally treated by vacuum annealing, electrical characteristics including leakage current characteristics are improved, compared with the as-deposited state.

Figure 10:
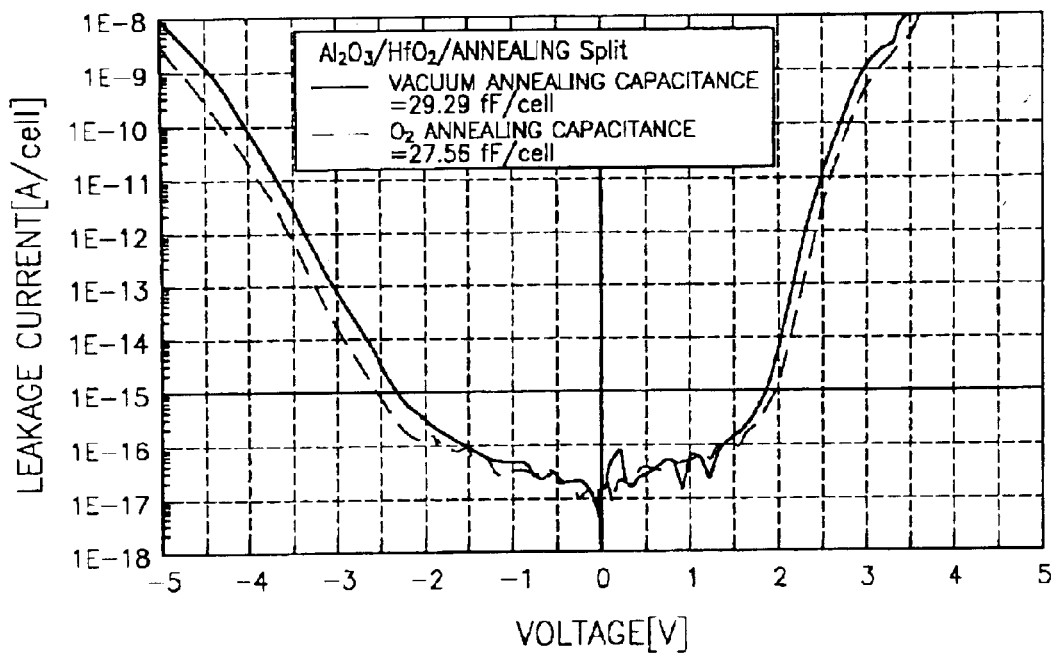
FIG. 10 is another graph showing electrical characteristics of capacitors formed having a composite $Al_2O_3/HfO_2$ dielectric layer structure using the method of FIGS. 8A through 8F.

FIG. 10 is a graph illustrating electrical characteristics of capacitors formed having the composite Al$_2$O$_3$/HfO$_2$ dielectric layer that are thermally treated using different methods. As shown in FIG. 10, when the composite Al$_2$O$_3$/HfO$_2$ dielectric layer is thermally treated by vacuum annealing, the electrical characteristics are further improved as compared with when the composite Al$_2$O$_3$/HfO$_2$ dielectric layer is thermally treated by O$_2$ annealing. The leakage current characteristics between vacuum annealing and O$_2$ annealing are almost the same, but the capacitance is improved by about 10% when vacuum annealing is applied.

Figure 11:
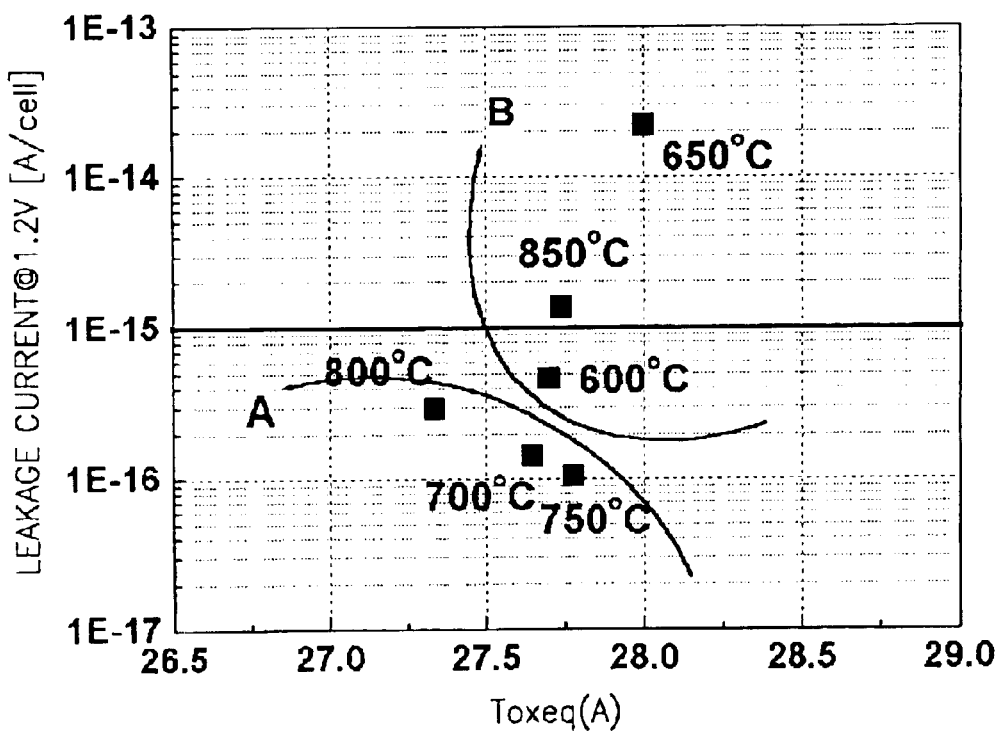
FIG. 11 is a graph of leakage current variations in relation to the temperature of vacuum anneal performed after the formation of the composite $Al_2O_3/HfO_2$ dielectric layer.

FIG. 11 is a graph of leakage current variations in capacitors having a composite Al$_2$O$_3$/HfO$_2$ dielectric layer in relation to a temperature of vacuum annealing performed after the formation of the composite Al$_2$O$_3$/HfO$_2$ dielectric layer. For the measurement of the leakage current variations of FIG. 11, test samples were manufactured in the same conditions in FIG. 9, except for the vacuum thermal treatment conditions. Referring to FIG. 11, in the vacuum thermal treatment conditions indicated by an arrow "A", the EOT and leakage current are relatively small, thereby evidencing improved electrical characteristics-of the capacitors.

Figure 12:
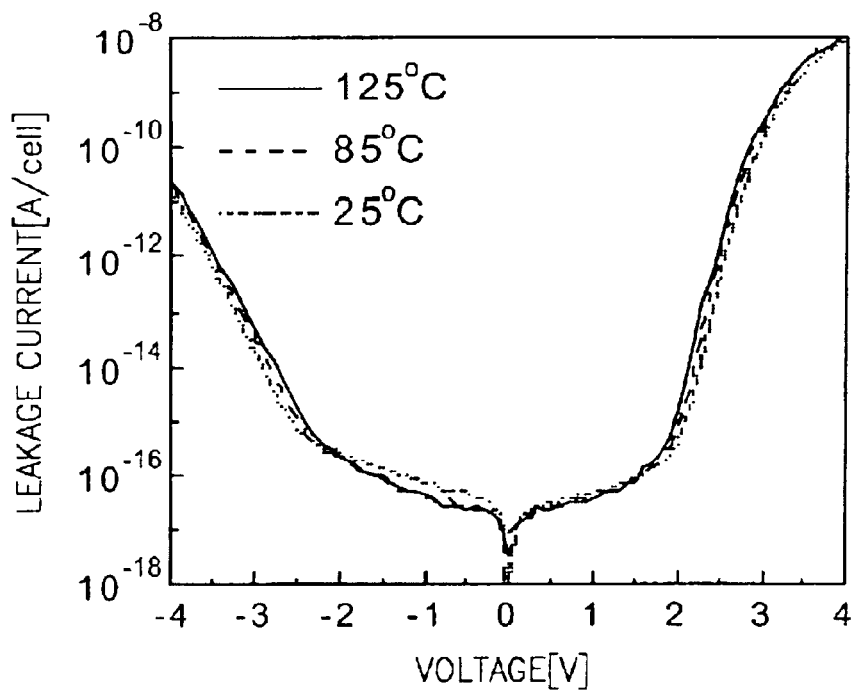
FIG. 12 shows current-voltage (I-V) characteristic curves illustrating temperature dependency of the electrical characteristics of capacitors having a composite $Al_2O_3/HfO_2$ dielectric layer structure.

FIG. 12 shows current-voltage (I-V) characteristic curves of capacitors having a composite Al$_2$O$_3$/HfO$_2$ dielectric layer, for evaluating temperature dependency of electrical characteristics of the capacitors. From FIG. 12, it appears that the temperature dependency of the leakage current is apparently negligible up to 125° C.

Figure 13:
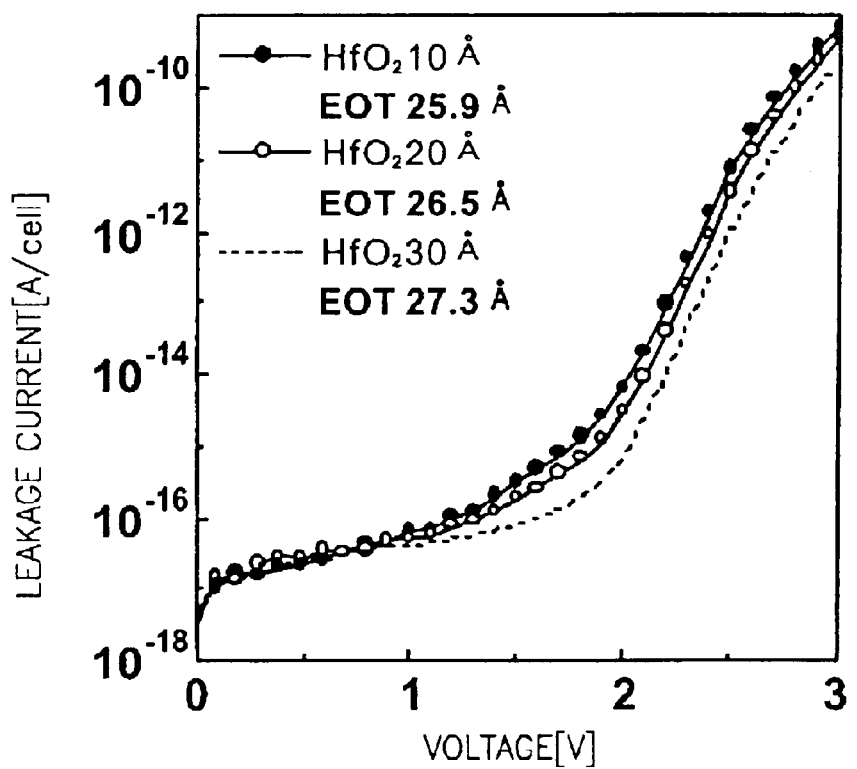
FIG. 13 provides current-voltage (I-V) characteristic curves showing electrical characteristic variations with respect to different thicknesses of the $HfO_2$ dielectric layer of capacitors having a composite $Al_2O_3/HfO_2$ dielectric layer structure vacuum annealed at 750° C., wherein the $Al_2O_3$ dielectric layer has a thickness of 35 Å.

FIG. 13 includes I-V characteristic curves showing electrical characteristic variations with respect to different thicknesses of the HfO$_2$ dielectric layer of a composite Al$_2$O$_3$/HfO$_2$ dielectric layer. In this graph, vacuum annealing is performed at 750° C., and the Al$_2$O$_3$ dielectric layer has a thickness of 35 Å. Referring to FIG. 13, as the thickness ratio of the Al$_2$O$_3$ dielectric layer and HfO$_2$ dielectric layer is varied, the leakage current characteristic and the EOT change.

The applicants evaluated the correlation between the Al$_2$O$_3$ dielectric layer thickness and the HfO$_2$ dielectric layer thickness as follows to ascertain a preferred thickness ratio of the Al$_2$O$_3$ dielectric layer and the HfO$_2$ dielectric layer.

Figure 14:
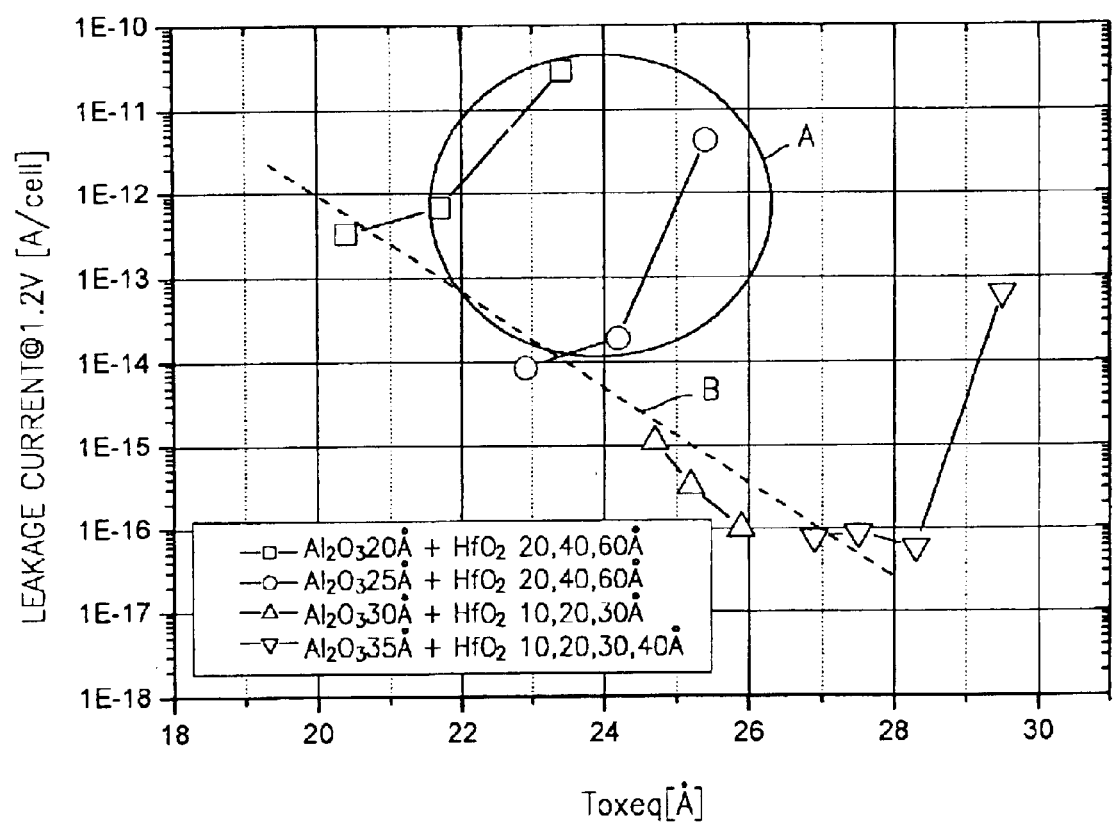
FIG. 14 is a graph showing leakage current distribution with respect to EOT at different thickness ratios between the $Al_2O_3$ dielectric layer and the $HfO_2$ dielectric layer of capacitors having a composite $Al_2O_3/HfO_2$ dielectric layer structure.

FIG. 14 is a graph is a graph representing leakage current distribution with respect to the EOT at different thickness ratios between an Al$_2$O$_3$ dielectric layer and an HfO$_2$ dielectric layer of capacitors having a composite Al$_2$O$_3$/HfO$_2$ dielectric layer structure. Referring to FIG. 14, in the region surrounded by circle "A", the composite Al$_2$O$_3$/HfO$_2$ dielectric layer structures have an Al$_2$O$_3$ dielectric layer whose thickness is greater than that of the HfO$_2$ dielectric layer. These structures show degradation of leakage current characteristics. In contrast, the composite Al$_2$O$_3$/HfO$_2$ dielectric layer structures shown along a dashed line "B" have a normal leakage current distribution.

Figure 15:
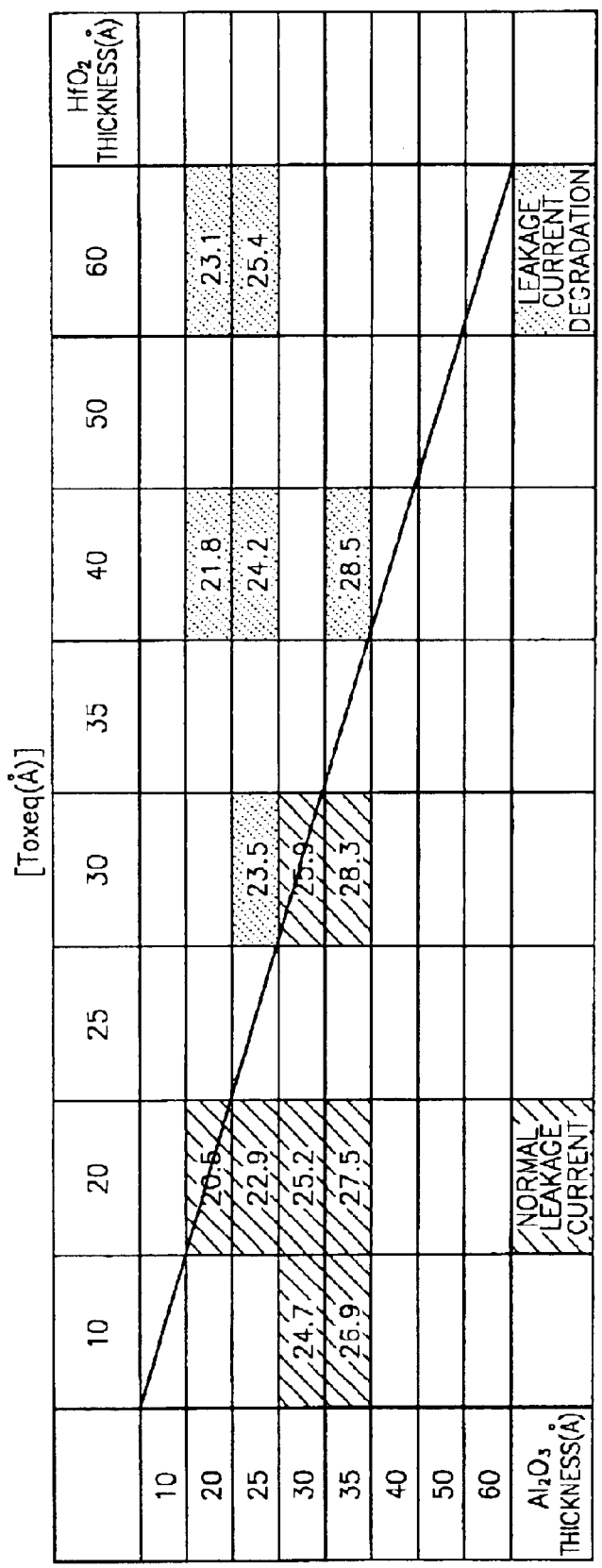
FIG. 15 is a table of providing EOT data for the test samples represented in FIG. 14.
Figure 16:
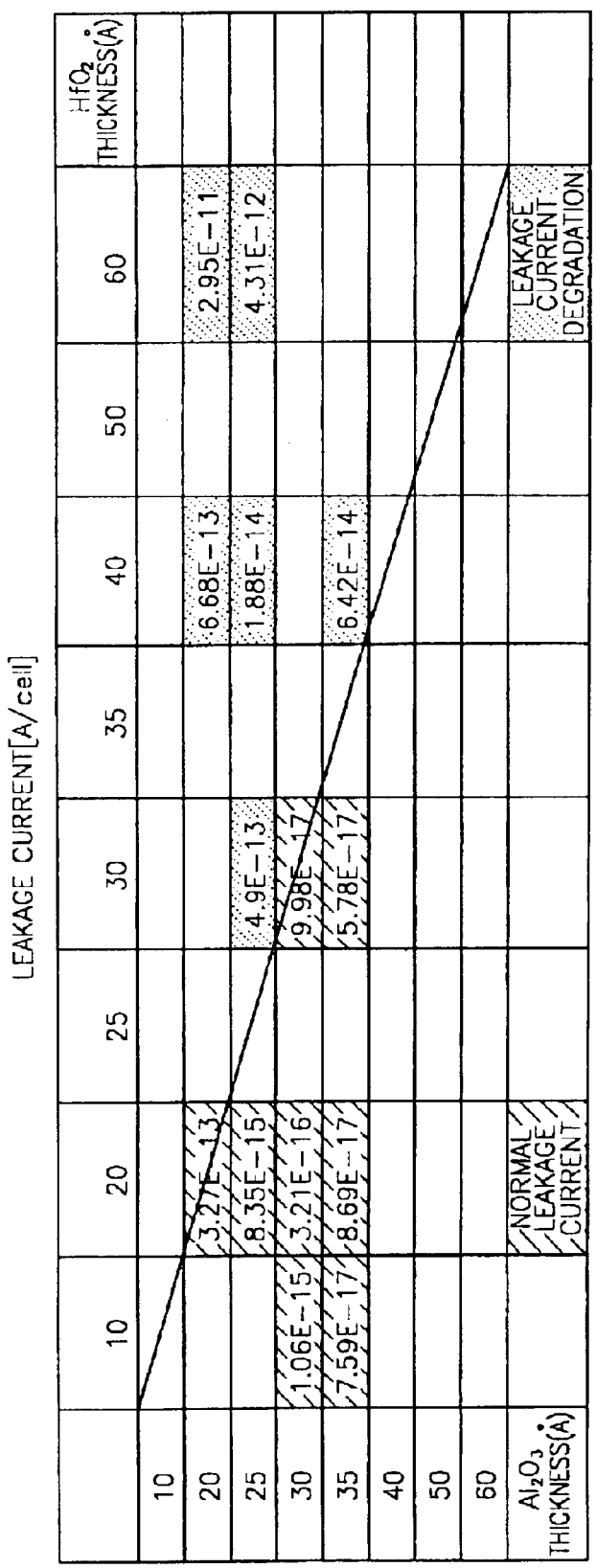
FIG. 16 is a table of leakage current data for the test samples represented in FIG. 14.

FIGS. 15 and 16 are tables showing the test data of FIG. 14, indicating leakage current degradation occurs with respect to the thickness ratio of the Al$_2$O$_3$ dielectric layer and the HfO$_2$ dielectric layer. The data in FIG. 15 indicate the EOT of each of the sample capacitors, and that of FIG. 16 indicates the leakage current of each of the sample capacitors. In FIGS. 15 and 16, data from circle "A" of FIG. 14 are expressed as "leakage current degradation", and data from dashed line "B" of FIG. 14 are expressed as "normal leakage current".

Figure 17:
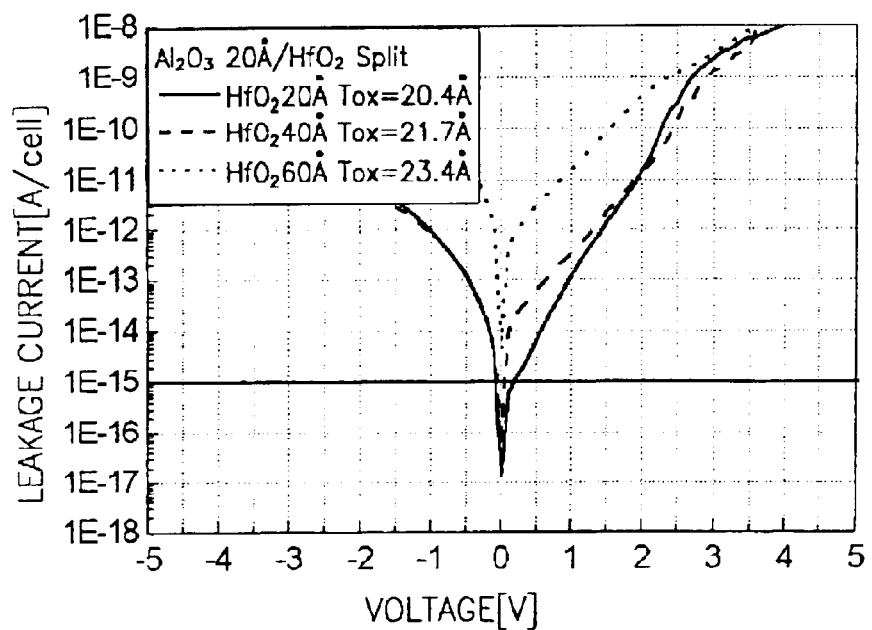
FIG. 17 is a graph of leakage current variations with respect to different thicknesses of an $HfO_2$ dielectric layer formed on an Al$_2$O$_3$ dielectric layer having a constant thickness in capacitors having the composite Al$_2$O$_3$/HfO$_2$ dielectric layer structure manufactured according to an embodiment of the present invention.

FIG. 17 is a graph of leakage current variations with respect to different thicknesses of an HfO$_2$ dielectric layer formed on an Al$_2$O$_3$ dielectric layer having a constant thickness of 20 Å. In FIG. 17, when a thickness ratio between the Al$_2$O$_3$ dielectric layer and the HfO$_2$ dielectric layer is less than 1.0 (i.e., when the thickness of the Al$_2$O$_3$ dielectric layer is smaller than that of HfO$_2$ dielectric layer), the leakage current characteristics degrade. When a thickness ratio between the Al$_2$O$_3$ dielectric layer and the HfO$_2$ dielectric layer is greater than 1.0 (i.e., when the thickness of the Al$_2$O$_3$ dielectric layer is greater than that of HfO$_2$ dielectric layer), leakage current characteristics are improved.

Figure 18:
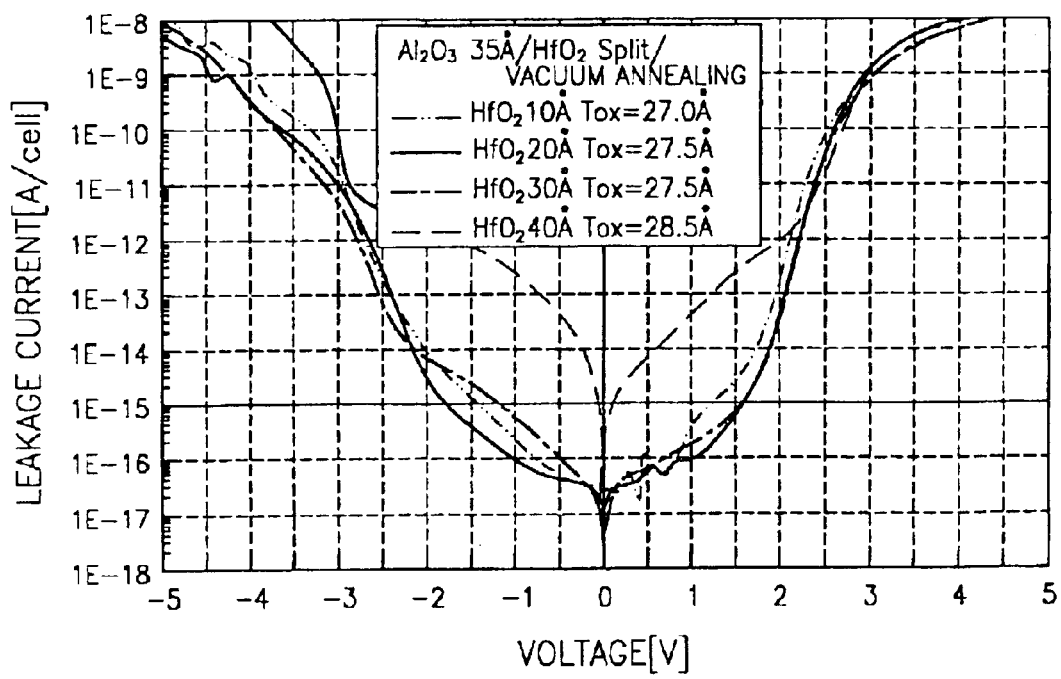
FIG. 18 is a graph showing leakage current variations for different thicknesses of an HfO$_2$ dielectric layer formed on a constant thickness Al$_2$O$_3$ dielectric layer in a composite Al$_2$O$_3$/HfO$_2$ dielectric layer.

FIG. 18 is a graph of leakage current variations with respect to different thicknesses of an HfO$_2$ dielectric layer formed on an Al$_2$O$_3$ dielectric layer having a thickness of 35 Å. In FIG. 18, when a thickness ratio between the Al$_2$O$_3$ dielectric layer and the HfO$_2$ dielectric layer is less than 1.0, the leakage current characteristics degrade. When a thickness ratio between the Al$_2$O$_3$ dielectric layer and the HfO$_2$ dielectric layer is greater than 1.0, the leakage current characteristics are improved.

Figure 19:
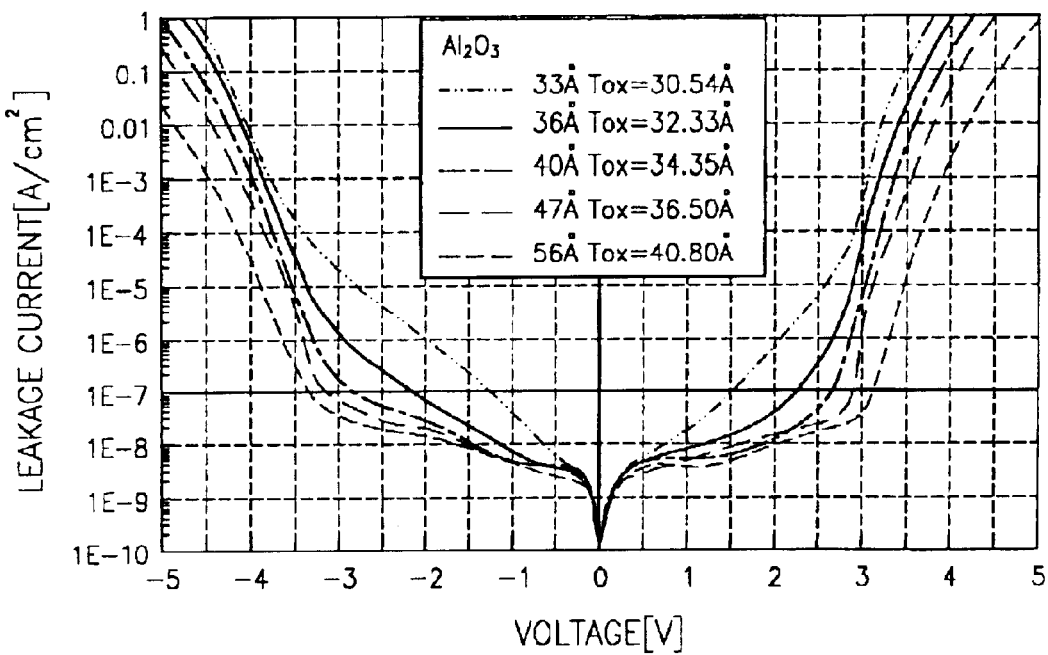
FIG. 19 is a comparison graph illustrating leakage current characteristics of capacitors having a single dielectric layer made of Al$_2$O$_3$.

FIG. 19 is a comparison graph showing leakage current characteristics of capacitors having a single $Al_2O_3$ dielectric layer. Referring to FIG. 19, as the thickness of the $Al_2O_3$ dielectric layer is reduced, the EOT is reduced. The leakage current of the dielectric layer greatly increases when the $Al_2O_3$ dielectric layer has a thickness of about 35 Å or less. From the results of FIG. 19, when the dielectric layer is constructed of only an $Al_2O_3$ layer, it is apparent that there is a limit to the amount by which the EOT of the dielectric layer can be reduced, namely, to an EOT of about 30 Å, considering the leakage current characteristics of the $Al_2O_3$ layer.

Figure 20:
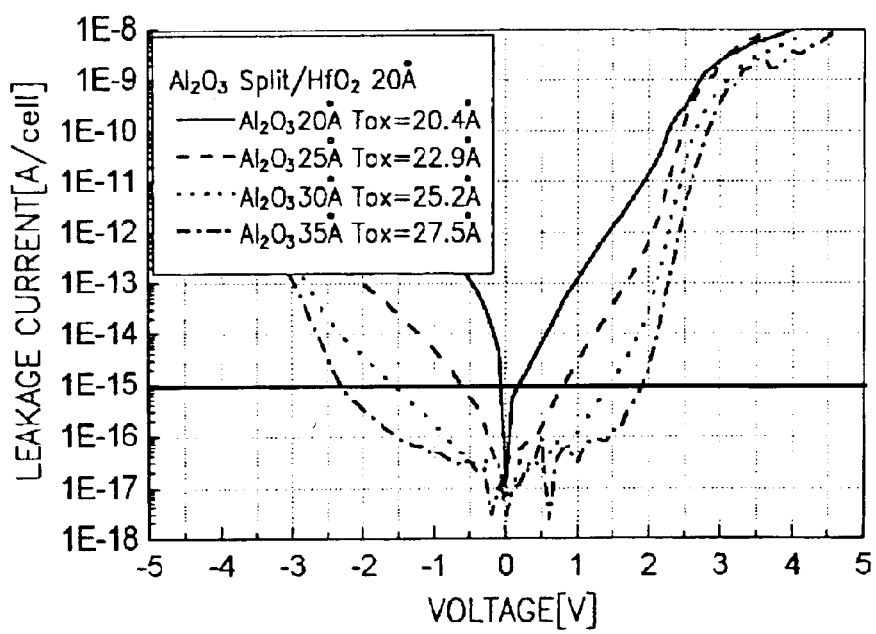
FIG. 20 is a graph showing leakage current variations resulting from different thicknesses of the Al$_2$O$_3$ dielectric layer in a composite Al$_2$O$_3$/HfO$_2$ dielectric layer structure having a constant HfO$_2$ dielectric layer thickness.

FIG. 20 is a graph illustrating leakage current variations with respect to different thicknesses of an $Al_2O_3$ dielectric layer in a composite $Al_2O_3/HfO_2$ dielectric layer, in which the $HfO_2$ dielectric layer has a constant thickness of 20 Å. In FIG. 20, when the $Al_2O_3$ dielectric layer has a thickness of 20 Å and 25 Å, the leakage current greatly increases in a voltage region of 2V or less. When the $Al_2O_3$ dielectric layer has a thickness of 30 Å and 35 Å, the leakage current characteristics are similar to that of a single $Al_2O_3$ dielectric layer although the composite $Al_2O_3/HfO_2$ dielectric layer structure has a smaller EOT.

Figure 21:
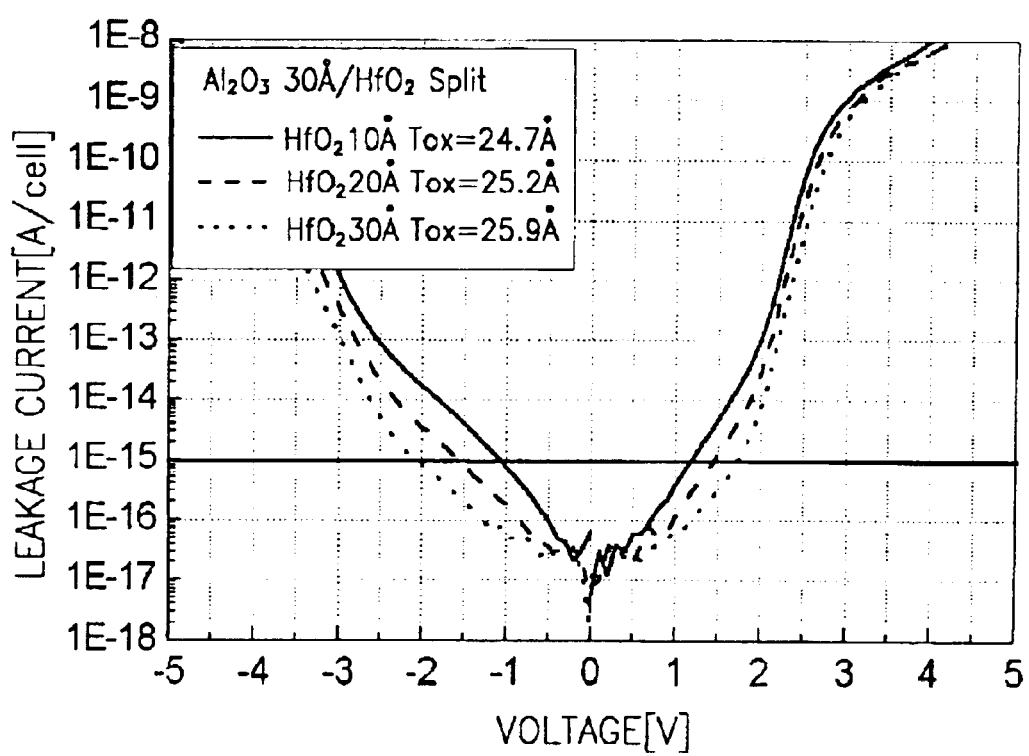
FIG. 21 is a graph illustrating leakage current variations with respect to different thicknesses of the HfO$_2$ dielectric layer formed on a constant thickness Al$_2$O$_3$ dielectric layer in capacitors having the composite Al$_2$O$_3$/HfO$_2$ dielectric layer structure according to an embodiment of the present invention.

FIG. 21 is a graph of leakage current variations with respect to different thicknesses of an $HfO_2$ dielectric layer formed on an $Al_2O_3$ dielectric layer having a constant thickness of 30 Å. In FIG. 21, as the thickness of the $HfO_2$ dielectric layer is increased, leakage current decreases. Although the degree of improvement in leakage current characteristic is very small, compared with increasing the thickness of the $Al_2O_3$ dielectric layer, it should be noted that increasing the thickness of the $HfO_2$ dielectric layer does not greatly affect the EOT.

Accordingly, leakage current characteristics of a capacitor having a composite $Al_2O_3/HfO_2$ dielectric layer is largely dependent upon the $Al_2O_3$ dielectric layer thickness, rather the $HfO_2$ dielectric layer thickness. To obtain stable leakage current characteristics in the capacitor having a composite $Al_2O_3/HfO_2$ dielectric layer, it is therefore preferable to provide the $Al_2O_3$ dielectric layer acting as an oxygen barrier layer with a thickness of 30 Å or greater.

Figure 22:
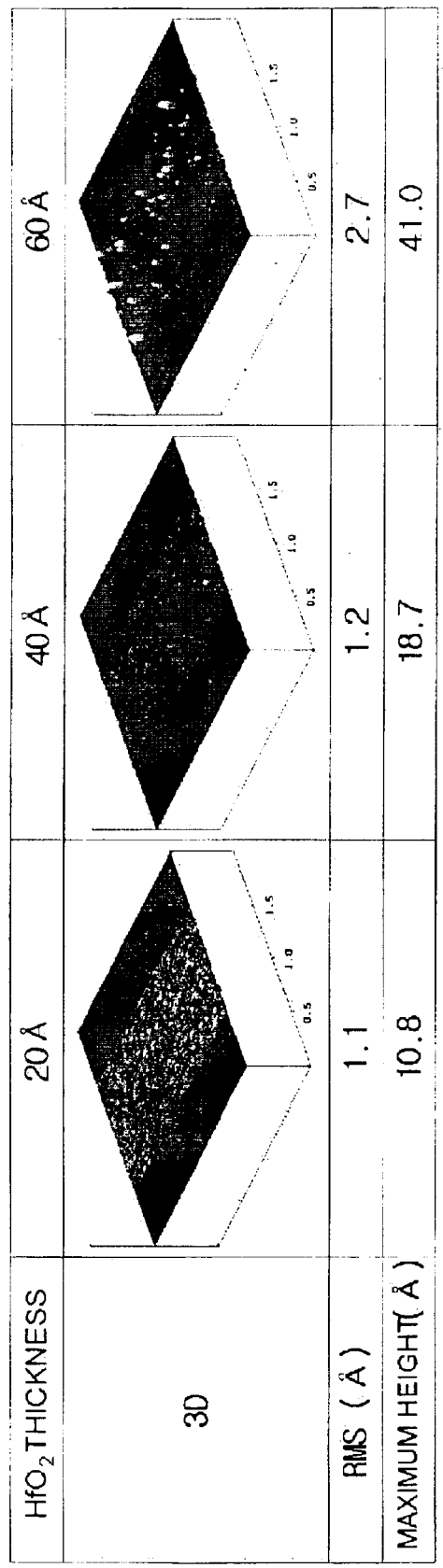
FIG. 22 provides atomic force microscopic (AFM) images illustrating characteristics of HfO$_2$ layers having different thicknesses.

In general, as the deposition thickness of the $HfO_2$ layer is increased, crystallization occurs during the deposition, which can be identified using an atomic force microscope (AFM). FIG. 22 shows AFM images for different thicknesses of the $HfO_2$ layer. As shown in FIG. 22, when the $HfO_2$ layer has a thickness of 60 Å, surface roughness greatly increases. As the thickness of the $HfO_2$ layer increases, partial crystallization occurs within the $HfO_2$ layer. Also, the crystallized portion of the $HfO_2$ layer grows at a relatively high rate as compared with an amorphous $HfO_2$ layer. As is apparent from the AFM images of FIG. 22, when the $HfO_2$ layer has a thickness of 60 Å, the $HfO_2$ layer becomes sharp and rough, thereby increasing surface roughness. According to the results of the AFM analysis, crystallization of the $HfO_2$ layer is initiated at a thickness of about 50 Å.

Figure 23:
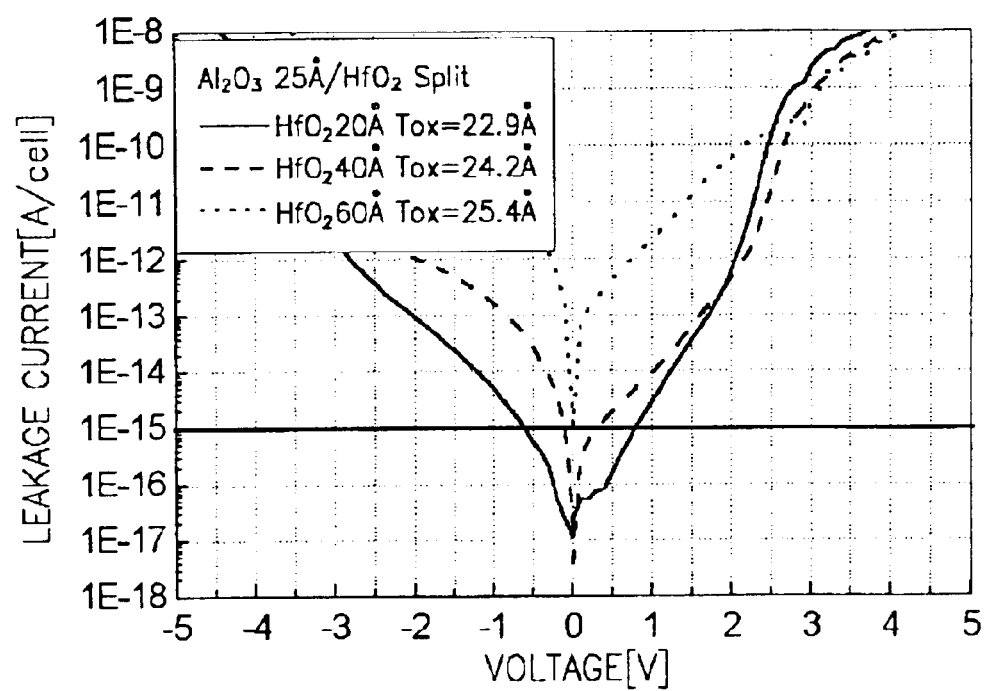
FIG. 23 is a graph of leakage current variations resulting from different HfO$_2$ dielectric layer thicknesses formed on a constant thickness Al$_2$O$_3$ dielectric layer in capacitors having the composite Al$_2$O$_3$/HfO$_2$ dielectric layer structure according to an embodiment of the present invention.

FIG. 23 is a graph showing leakage current variations for different thicknesses of an $HfO_2$ dielectric layer formed on a constant thickness $Al_2O_3$ dielectric layer (25 Å). Although it was expected that the leakage current characteristics would be further improved by increasing the thickness of the $HfO_2$ dielectric layer, FIG. 23 shows that the leakage current characteristic is instead degraded as the thickness of the $HfO_2$ dielectric layer is increased. This is believed to be a result of the crystallization of the $HfO_2$ dielectric layer. In other words, as the thickness of the $HfO_2$ dielectric layer is increased, crystalline $HfO_2$ grains begin to grow. As the $HfO_2$ grains grow into the $Al_2O_3$ layer of the composite $Al_2O_3/HfO_2$ dielectric layer structure, they act as leakage current paths within the dielectric layer to degrade the leakage current characteristics thereby.

The results of the above measurements, indicate that to reduce leakage current in a capacitor having a composite $Al_2O_3/HfO_2$ dielectric layer structure, the thickness of the $HfO_2$ dielectric layer is preferably smaller than the thickness at which crystallization of the $HfO_2$ layer is initiated. For example, the thickness is preferably about 40 Å or less, e.g., about 10–40 Å.

FIGS. 24A through 24F are partial cross-sectional views illustrating a method of manufacturing a capacitor of a semiconductor memory device according to a third embodiment of the present invention.

When forming a capacitor upper electrode using a source gas containing chlorine atoms, such as $TiCl_4$, leakage current characteristics tend to significantly degrade the operation of a capacitor having an $HfO_2$ dielectric layer. Therefore, to improve the leakage current characteristics of the capacitor in which the upper electrode is formed using a Cl-containing source gas, a method for blocking the effect of the Cl atoms is desirable.

Figure 24A:
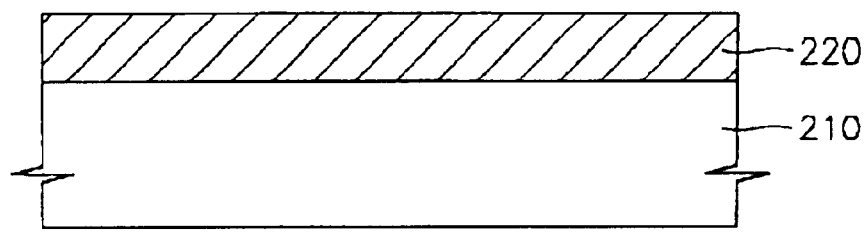
FIGS. 24A through 24F are partial cross-sectional views illustrating a method for manufacturing a capacitor of a semiconductor memory device according to a third embodiment of the present invention.
Figure 24B:
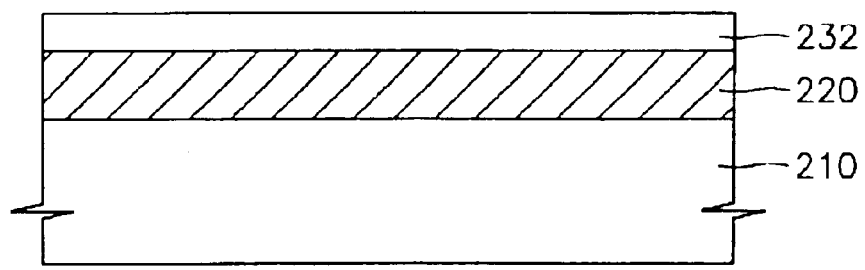

Referring to FIG. 24A, a lower electrode 220 is preferably formed on a semiconductor substrate 210 having a thickness in a range of about tens to hundreds of angstroms (Å). The lower electrode 220 may be formed using the same or similar methods as described above. Referring to FIG. 24B, an $HfO_2$ dielectric layer 232 is formed on the lower electrode 220. The $HfO_2$ dielectric layer 232 may be formed using the same or similar method as described with reference to FIG. 1B. For example, the $HfO_2$ dielectric layer 232 preferably has a thickness of about 20–80 Å.

Figure 24C:
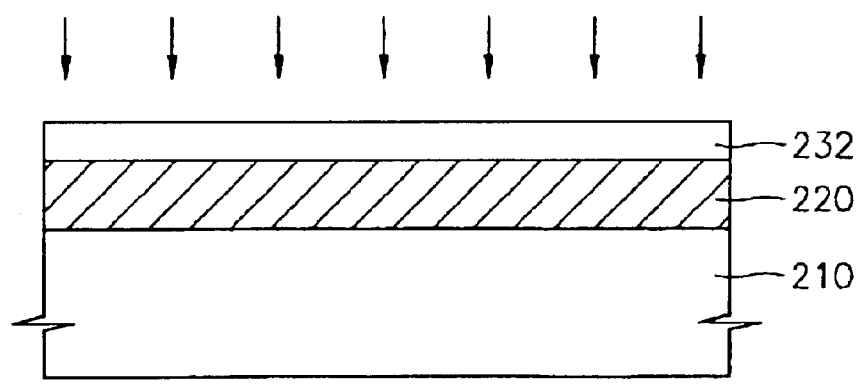

Referring to FIG. 24C, the $HfO_2$ dielectric layer 232 is preferably thermally treated by vacuum annealing. The vacuum annealing can be performed using the same or similar method as described with reference to FIG. 1C. Through vacuum annealing, impurities, such as carbon, which remain on the $HfO_2$ dielectric layer 232 can be effectively removed, and the $HfO_2$ dielectric layer 232 can be effectively densified.

Figure 24D:
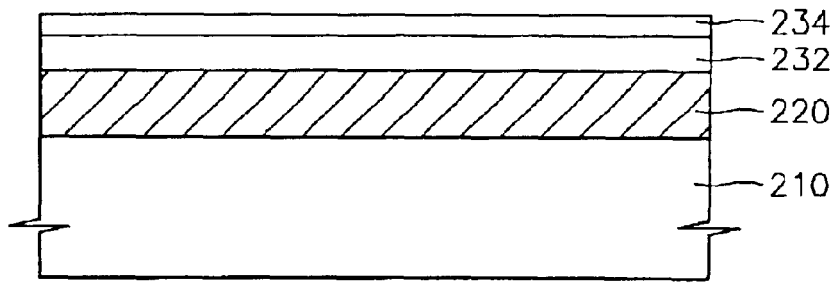

Referring to FIG. 24D, a Cl barrier layer 234 is formed on the $HfO_2$ dielectric layer 232 thermally treated by vacuum annealing. When a Cl-containing gas such as $TiCl_4$ is used to form an upper electrode of the capacitor including an $HfO_2$ dielectric layer, the leakage current characteristics of the capacitor become significantly degraded. In this embodiment, the Cl barrier layer 234 is formed on the $HfO_2$ dielectric layer 232 to block the adverse effect of Cl atoms on the upper electrode. The Cl barrier layer 234 can be formed, for example, of $Al_2O_3$, $Ta_2O_5$, $SiO_2$, or $Si_3N_4$. The Cl barrier layer 234 is preferably formed to a thickness of about 3–50 Å and, most preferably, to a thickness of about 10–20 Å.

The Cl barrier layer 234 is formed by CVD or ALD. When the Cl barrier layer 234 is formed of $Al_2O_3$ using CVD, the Cl barrier layer 234 is deposited, for example, using TMA and $H_2O$ at a temperature of about 400–500° C. and a pressure of about 1–5 torr. When the Cl barrier layer 234 is formed of $Al_2O_3$ using ALD, the Cl barrier layer 234 is preferably deposited using TMA as a first reactant and $O_3$ as a second reactant at a temperature of about 250–400° C. and a pressure of about 1–5 torr. The deposition and purging processes are repeated until an $Al_2O_3$ layer teaches the desired thickness. Suitable first reactants for the $Al_2O_3$ layer include, for example, $AlCl_3$, $AlH_3N(CH_3)_3$, $C_6H_{15}AlO$, $(C_4H_9)_2AlH$, $(CH_3)_2AlCl$, $(C_2H_5)_3Al$, or $(C_4H_9)_3Al$, as well as TMA. $H_2O$, or an activated oxidizing agent, such as plasma $N_2O$, plasma $O_2$, may be used as the second reactant.

Figure 24E:
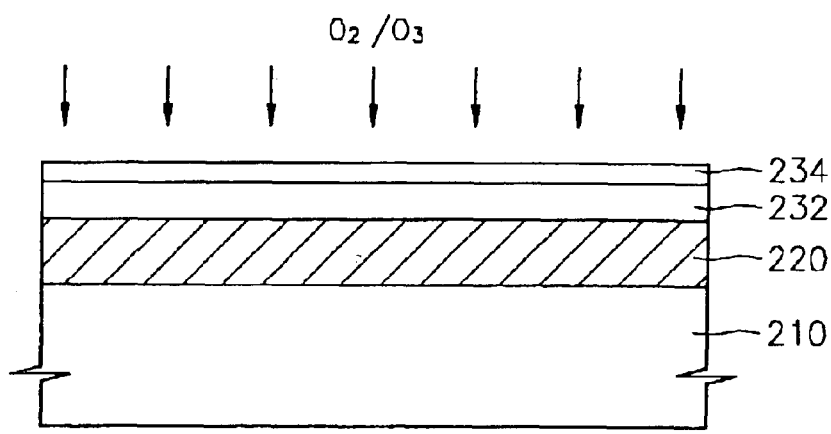

Referring to FIG. 24E, the resultant structure having the Cl barrier layer 234 is thermally treated in an $O_3$ or $O_2$ plasma condition at a temperature of about 250–400° C., and preferably, about 300–400° C. This step can be omitted. The Cl barrier layer 234 is thermally treated at a pressure of about 5–50 torr in the $O_3$ plasma condition and at a pressure of about 0.1–5 torr in the $O_2$ plasma condition.

Figure 24F:
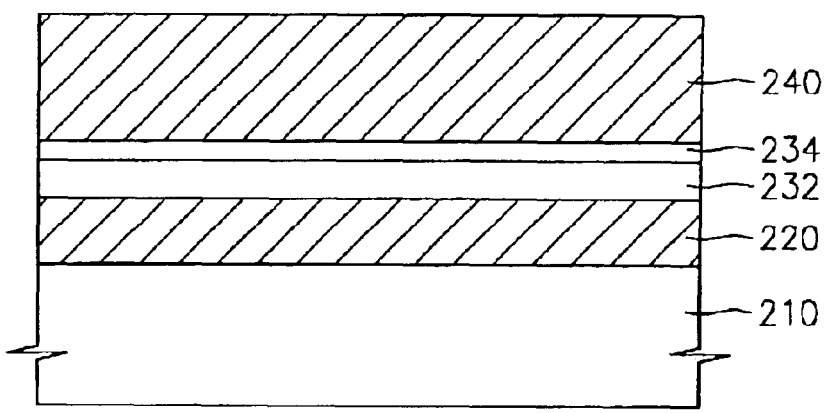

Referring to FIG. 24F, an upper electrode 240 is formed on the Cl barrier layer 234 thermally treated in the oxygen condition, to a thickness of about 50–2000 Å. The upper electrode 240 is formed of polysilicon, a metal nitride, or a noble metal. For example, the upper electrode 240 may be formed of a single layer of polysilicon, TiN, TaN, WN, Ru, Ir, or Pt, or a composite layer of these materials. The upper electrode 240 is preferably formed using ALD, CVD, or MOCVD.

Figure 25:
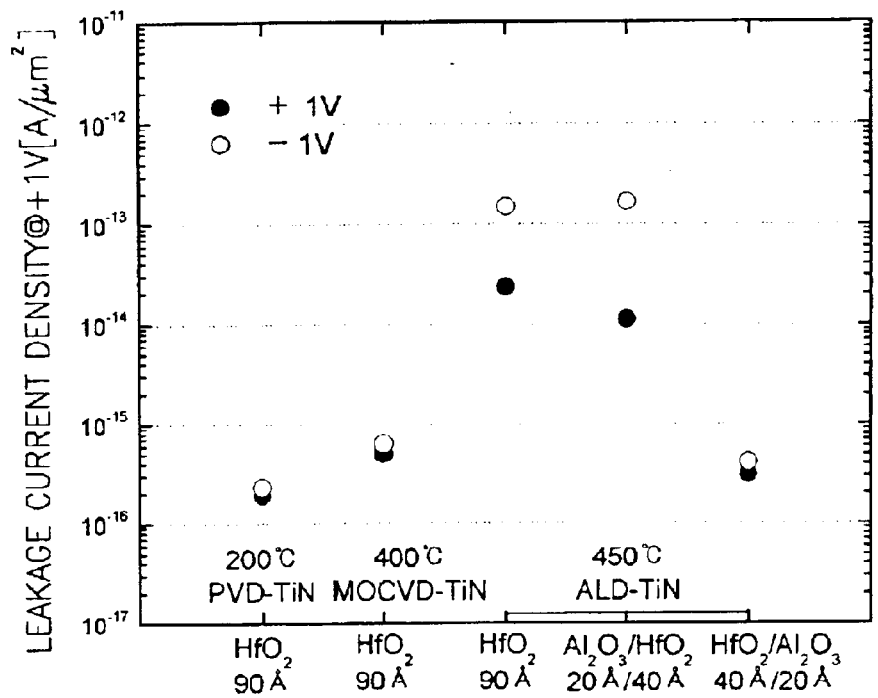
FIG. 25 is a graph showing the effect of forming an upper electrode on the HfO$_2$ dielectric layer on leakage current characteristics of a capacitor having an HfO$_2$ dielectric layer/Al$_2$O$_3$ Cl-barrier layer structure.

FIG. 25 is a graph showing how forming the upper electrode on the $HfO_2$ dielectric layer affects the leakage current characteristics of a capacitor having an $HfO_2$ dielectric layer/$Al_2O_3$ Cl-barrier layer structure. Leakage current characteristics for a single $HfO_2$ dielectric layer formed by ALD, where the Cl barrier layer was not formed, having an upper electrode formed by a variety of methods, are shown for comparison.

From FIG. 25, it is evident that the leakage current characteristics of the capacitor are largely dependent upon the method used to form the upper electrode. When the upper electrode ("ALD-TIN") is formed of TiN on the $HfO_2$ dielectric layer by ALD using $TiCl_4$ and $NH_3$ as reactant gases, the leakage current characteristics become significantly degraded. The leakage current characteristic degradation results from Cl radicals generated when the TiN upper electrode is formed by ALD. Therefore, when the upper electrode is directly formed on the $HfO_2$ dielectric layer, a physical vapor deposition (PVD) or MOCVD method is desirable to avoid the effect of the Cl radicals on the upper electrode. In a capacitor having an $HfO_2$ dielectric layer/$Al_2O_3$ Cl-barrier layer structure, leakage current degradation is prevented by an $Al_2O_3$ Cl-barrier layer while an upper electrode is formed by ALD.

Figure 26:
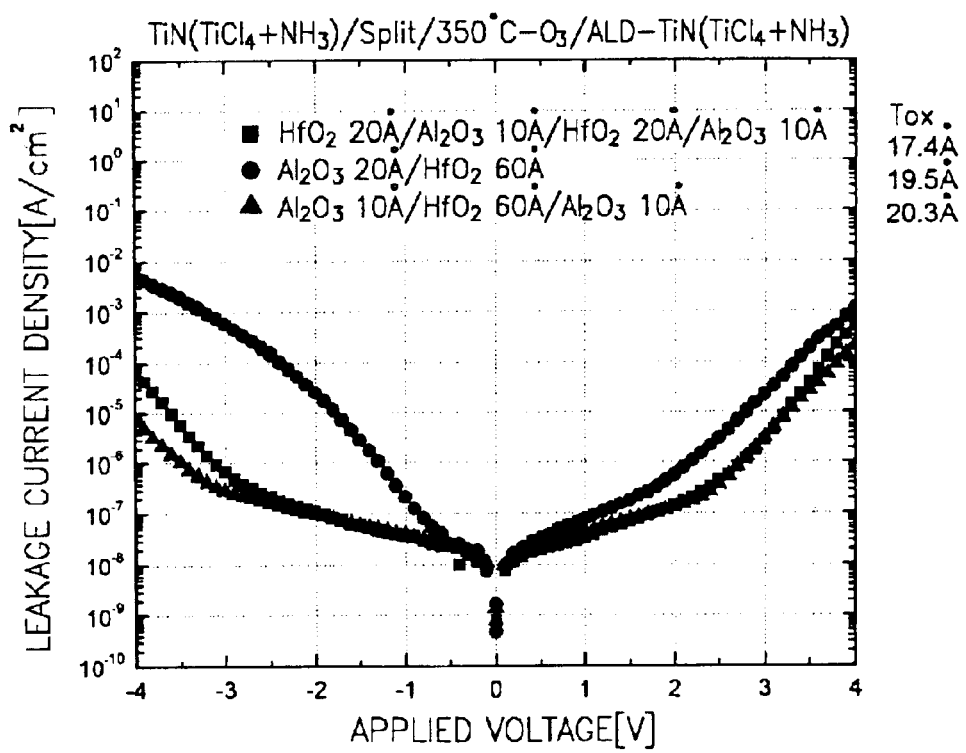
FIG. 26 is a graph showing electrical characteristics of capacitors having an HfO$_2$ dielectric layer/Al$_2$O$_3$ Cl-barrier layer structure according to an embodiment of the present invention.

FIG. 26 is a graph of electrical characteristics of capacitors having the $Al_2O_3$ Cl-barrier layer formed on the $HfO_2$ dielectric layer. As shown in FIG. 26, when the TiN upper electrode formed by ALD using $TiCl_4$ and $NH_3$ as reactant gases contacts the $Al_2O_3$ Cl-barrier layer, the leakage current characteristics are improved when compared with the situation in which the TiN upper electrode directly contacts the $HfO_2$ dielectric layer. The $Al_2O_3$ layer, therefore, effectively blocks the Cl radicals during the formation of the upper electrode.

Figure 27A:
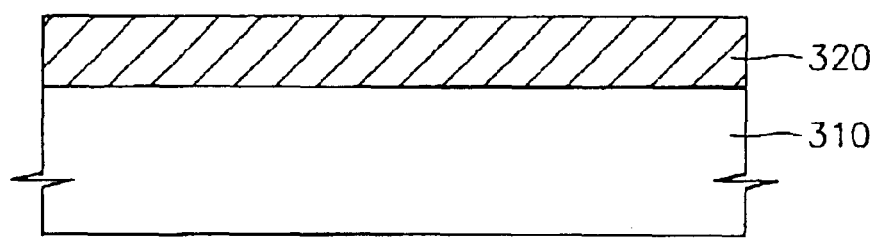
FIGS. 27A through 27G are partial cross-sectional views illustrating a method for manufacturing a capacitor of a semiconductor memory device according to a fourth embodiment of the present invention.

FIGS. 27A through 27G are partial cross-sectional views illustrating a method for manufacturing a capacitor of a semiconductor memory device according to a fourth embodiment of the present invention. Referring to FIG. 27A, a lower electrode 320 is formed on a semiconductor substrate 310 to a thickness of about tens to hundreds of angstroms (Å). The lower electrode 320 may be formed using the same or similar methods described above.

Figure 27B:
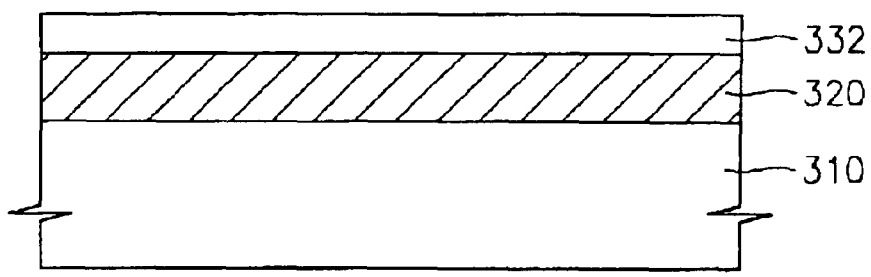

Referring to FIG. 27B, an $Al_2O_3$ dielectric layer 332 is formed on the lower electrode 320. The $Al_2O_3$ dielectric layer 332 prevents the lower electrode 320 from being oxidized during subsequent thermal treatment on the dielectric layer when the lower electrode 320 is formed of a metal layer, such as a metal nitride or a noble metal. The $Al_2O_3$ dielectric layer 332 is preferably formed using the method as described with reference to FIG. 8B.

Figure 27C:
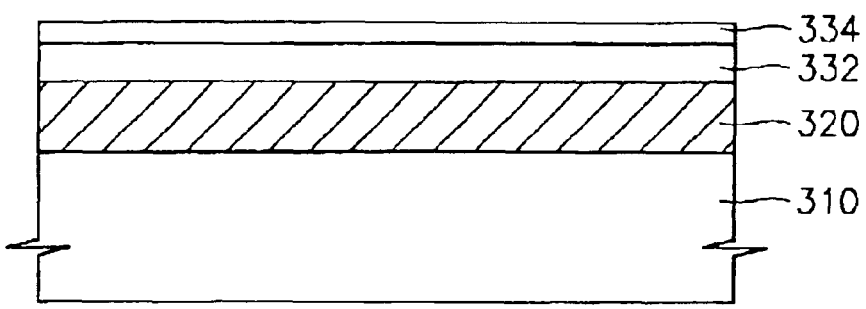

Referring to FIG. 27C, an $HfO_2$ dielectric layer 334 is formed on the $Al_2O_3$ dielectric layer 332. The $HfO_2$ dielectric layer 334 may be formed using the same method as described with reference to FIG. 1B or 8C.

Figure 27D:
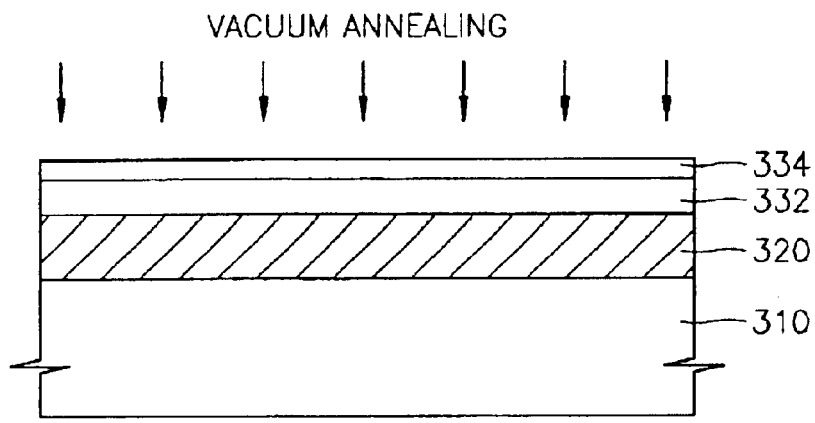

Referring to FIG. 27D, the $HfO_2$ dielectric layer 334 is thermally treated by vacuum annealing. Vacuum annealing is preferably performed using the same method described previously with reference to FIG. 1C. Through vacuum annealing, impurities, such as carbon, remaining on the $HfO_2$ dielectric layer 334 can be effectively removed, and the $HfO_2$ dielectric layer 334 can be effectively densified.

Figure 27E:
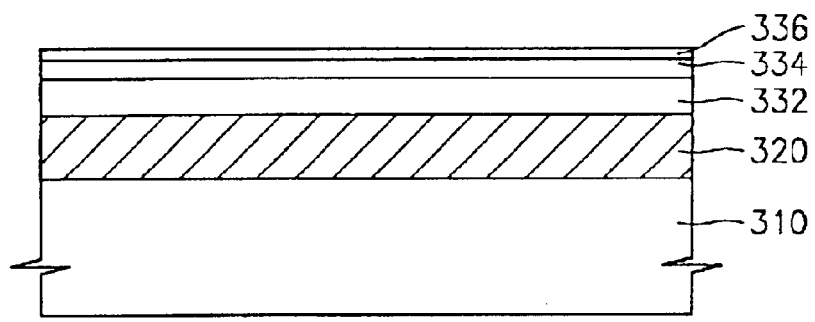
Figure 27F:
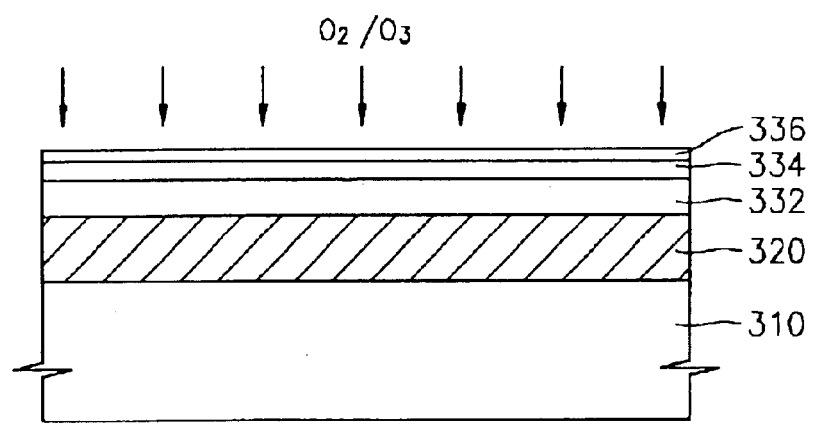

Referring to FIG. 27E, a Cl barrier layer 336 is formed on the $HfO_2$ dielectric layer 334 thermally treated by vacuum annealing. The Cl barrier layer 336 is formed using the method described previously with reference to FIG. 24D. The formation of the Cl barrier layer 336 blocks the adverse effect of Cl atoms on the upper electrode to be formed in a subsequent process. The Cl barrier layer 336 is formed of, for example, $Al_2O_3$, $Ta_2O_5$, $SiO_2$, or $Si_3N_4$. Referring to FIG. 27E, the resultant structure having the Cl barrier layer 336 formed by the method described with reference to FIG. 24E can then optionally be thermally treated in an $O_3$ or $O_2$ plasma condition.

Figure 27G:
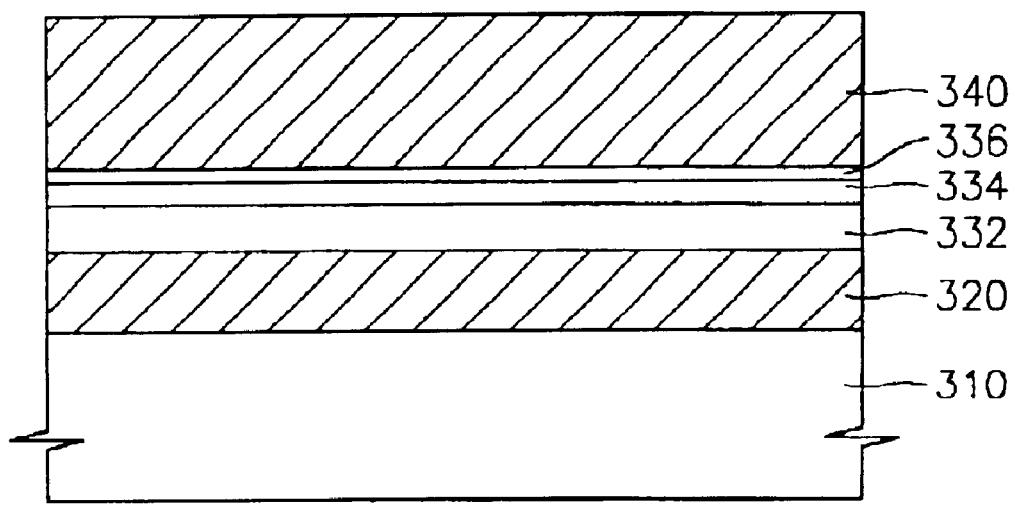

Referring to FIG. 27G, an upper electrode 340 is formed to a thickness of about 50–2000 Å on the Cl barrier layer 336. The upper electrode 340 can be formed of polysilicon, a metal nitride, or a noble metal. For example, the upper layer 340 may be a single layer of doped polysilicon, TiN, TaN, WN, Ru, Ir, or Pt, or a composite layer of these materials. The upper electrode 340 is preferably formed by ALD, CVD, or MOCVD. Although the upper electrode 240 is deposited using a Cl-containing source material, such as $TiCl_4$, $TaCl_5$, $WCl_6$, the Cl barrier layer 336 effectively blocks the Cl atoms.

In the above embodiment, because the $Al_2O_3$ dielectric layer 332 is formed between the lower electrode 320 and the $HfO_2$ dielectric layer 334, and the Cl barrier layer 336 is formed between the $HfO_2$ dielectric layer 334 and the upper electrode 340, the lower electrode 320 can be effectively protected from oxidation during subsequent thermal treatment on the dielectric layer. The adverse effect of the Cl atoms during the formation of the upper electrode 340 can thereby be eliminated. Also, the formation of the $HfO_2$ dielectric layer 334 is followed by vacuum thermal treatment, so that impurities can be effectively removed from the $HfO_2$ dielectric layer 334, and the leakage current characteristics of the dielectric layer can be stably maintained.

In the above-described embodiments, the method for forming a dielectric layer including a $HfO_2$ dielectric layer and the subsequent vacuum annealing method have been described in connection with the manufacture of a capacitor of a semiconductor memory device. The embodiments are not, however, intended to limit the scope of the present invention. Rather, the principles of the present invention can be applied to any other highly-integrated semiconductor devices, as long as a dielectric layer is involved. For example, the methods are applicable to the formation of a gate stack including a gate dielectric formed on a semiconductor substrate. In addition, although the vacuum annealing methods have been described with reference to the $HfO_2$ dielectric layer in the above embodiments, those skilled in the art will appreciate that vacuum annealing can be performed on a variety of other high-k dielectric layers such as $Y_2O_3$, $Al_2O_3$, $TiO_2$, $BaO$, $SrO$, $ZrO_2$, $Ta_2O_5$, $Mb_2O_5$, whether as a single layer or a composite layer of these materials.

Also, the Cl barrier layer can be formed on dielectric layers other than the $HfO_2$ dielectric layer and effectively block Cl atoms when the capacitor upper electrode is formed using a Cl-containing source material.

In conclusion, with embodiments of the present invention, among other things, impurities remaining in the dielectric layer can be effectively removed, and the dielectric layer can be effectively densified. As a result, electrical characteristics of the semiconductor device can be significantly improved. For example, the leakage current is reduced and capacitance is increased.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for forming a capacitor, the method comprising:
    forming a lower electrode on a semiconductor substrate;
    forming a dielectric layer on the lower electrode;
    vacuum annealing the dielectric layer; and
    forming an upper electrode on the dielectric layer, wherein the vacuum annealing is performed on the dielectric layer at a temperature of about 200–850° C. in a chamber, while evacuating the chamber to a high vacuum level of about $1 \times 10^{-8}$–1 torr.

2. The method of claim 1, wherein the lower electrode is a single layer of doped polysilicon, TiN, TaN, WN, Ru, Ir, or Pt, or a composite layer of doped polysilicon, TiN, TaN, WN, Ru, Ir, or Pt.

3. The method of claim 1, wherein the dielectric layer is formed to a thickness of about 20–200 Å.

4. The method of claim 1, wherein the dielectric layer comprises $HfO_2$, $Y_2O_3$, $Al_2O_3$, $TiO_2$, BaO, SrO, $ZrO_2$, $Ta_2O_5$, $Mb_2O_5$ or combinations thereof.

5. The method of claim 1, wherein the vacuum annealing is performed without supplying an inert gas or a reactant gas onto the dielectric layer.

6. The method of claim 1, wherein the temperature is about 700–800° C. when the lower electrode is formed of polysilicon, or about 400–600° C. when the lower electrode is formed of a metal nitride or a noble metal.

7. The method of claim 1, wherein the upper electrode is formed by MOCVD, using a non-Cl-containing material as the source material.

8. The method of claim 1, wherein the forming a dielectric comprises:
    forming a first dielectric layer on the lower electrode; and
    forming a second dielectric layer on the first dielectric layer.

9. The method of claim 8, wherein the first dielectric layer has a dielectric constant lower than that of the second dielectric layer.

10. The method of claim 8, wherein the first dielectric layer is an $Al_2O_3$ dielectric layer.

11. The method of claim 10, wherein the $Al_2O_3$ dielectric layer is formed to a thickness of about 20–60 Å.

12. The method of claim 10, wherein the second dielectric layer is an $HfO_2$ dielectric layer.

13. The method of claim 12, wherein the $HfO_2$ dielectric layer is formed to a thickness of about 10–40 Å.

14. The method of claim 12, wherein the thickness of the $Al_2O_3$ dielectric layer is greater than that of the $HfO_2$ dielectric layer.

15. The method of claim 8, after vacuum annealing, further comprising thermally treating the second dielectric layer in an $O_3$ or $O_2$ plasma condition.

16. The method of claim 15, wherein the thermal treating in an $O_3$ or $O_2$ plasma condition is performed at a temperature of about 200–600° C.

17. The method of claim 16, wherein the thermal treating is performed at about 300–400° C.

18. The method of claim 15, wherein the second dielectric layer is thermally treated at a pressure of about 5–50 torr in the $O_3$ plasma condition, or at a pressure of about 0.1–5 torr in the $O_2$ plasma condition.

19. The method of claim 8, before vacuum annealing, further comprising thermally treating the second dielectric layer in an $O_3$ or $O_2$ plasma condition.

20. A method for forming a capacitor, the method comprising:
    forming a lower electrode on a semiconductor substrate;
    forming a dielectric layer on the lower electrode;
    forming a Cl barrier layer on the dielectric layer; and
    forming an upper electrode on the Cl barrier layer.

21. The method of claim 20, before forming the Cl barrier layer, further comprising vacuum annealing the dielectric layer.

22. The method of claim 21, wherein the vacuum annealing is performed on the dielectric layer at a temperature of about 200–850° C. in a chamber, while evacuating the chamber to a high vacuum level of about $1 \times 10^{-8}$–1 torr.

23. The method of claim 20, wherein the dielectric layer is an $HfO_2$ dielectric layer.

24. The method of claim 23, wherein the $HfO_2$ dielectric layer is formed to a thickness of about 20–80 Å.

25. The method of claim 20, wherein the Cl barrier layer comprises $Al_2O_3$, $Ta_2O_5$, $SiO_2$, or $Si_3N_4$.

26. The method of claim 20, wherein the Cl barrier layer is formed to a thickness of about 3–50 Å.

27. The method of claim 26, wherein the Cl barrier layer is formed to a thickness of about 10–20 Å.

28. The method of claim 20, wherein the Cl barrier layer comprises $Al_2O_3$ by CVD.

29. The method of claim 28, wherein the Cl barrier layer is deposited, using TMA, $AlCl_3$, $AlH_3N(CH_3)_3$, $C_6H_{15}AlO$, $(C_4H_9)_2AlH$, $(CH_3)_2AlCl$, $(C_2H_5)_3Al$, or $(C_4H_9)_3Al$ and $H_2O$ at a temperature of about 400–500° C. and a pressure of about 1–5 torr.

30. The method of claim 20, wherein the Cl barrier layer is formed of $Al_2O_3$ by ALD.

31. The method of claim 30, wherein the Cl barrier layer is deposited using TMA as a first reactant and $O_3$, $H_2O$, or plasma $N_2O$, plasma $O_2$ as a second reactant.

32. The method of claim 31, wherein the deposition is performed at a temperature of about 250–400° C. and a pressure of about 1–5 torr.

33. The method of claim 20, further comprising thermally treating the resultant structure having the Cl barrier layer in an $O_3$ or $O_2$ plasma condition at a temperature of about 250–400° C.

34. The method of claim 33, wherein the temperature is about 300–400° C.

35. The method of claim 33, wherein the Cl barrier layer is thermally treated at a pressure of about 5–50 torr in the $O_3$ plasma condition, or at a pressure of about 0.1–5 torr in the $O_2$ plasma condition.

36. The method of claim 23, further comprising:
    forming an $Al_2O_3$ dielectric layer on the lower electrode before forming an $HfO_2$ dielectric layer.

37. The method of claim 36, wherein the $Al_2O_3$ dielectric layer prevents the lower electrode from being oxidized during subsequent thermal treatment on the dielectric layer.

38. The method of claim 20, wherein the upper electrode is formed to a thickness of about 50–2000 Å, using a Cl-containing source material.

39. A method for forming a semiconductor device, the method comprising:

forming a dielectric layer on a semiconductor substrate; and vacuum annealing the dielectric layer, wherein the vacuum annealing is performed on the dielectric layer at a temperature of about 200–850° C. in a chamber, while evacuating the chamber to a high vacuum level of about $1 \times 10^{-8}$–1 torr.

40. The method of claim 39, further comprising forming a gate electrode on the vacuum annealed dielectric layer.

41. The method of claim 39, wherein the dielectric layer is a single layer of $Y_2O_3$, $Al_2O_3$, $TiO_2$, BaO, SrO, $ZrO_2$, $Ta_2O_5$, $Mb_2O_5$ or a composite layer of $Y_2O_3$, $Al_2O_3$, $TiO_2$, BaO, SrO, $ZrO_2$, $Ta_2O_5$, $Mb_2O_5$.

* * * * *